United States Patent
Huemoeller et al.

(10) Patent No.: US 7,247,523 B1
(45) Date of Patent: Jul. 24, 2007

(54) TWO-SIDED WAFER ESCAPE PACKAGE

(75) Inventors: Ronald Patrick Huemoeller, Chandler, AZ (US); Russ Lie, Phoenix, AZ (US); David Hiner, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/047,848

(22) Filed: Jan. 31, 2005

Related U.S. Application Data

(63) Continuation-in-part of application No. 10/291,050, filed on Nov. 8, 2002, now Pat. No. 6,905,914.

(51) Int. Cl.
*H01L 21/00* (2006.01)

(52) U.S. Cl. ...................................... 438/118
(58) Field of Classification Search ................ 438/118
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |

(Continued)

FOREIGN PATENT DOCUMENTS

DE 197 34 794 7/1998

(Continued)

OTHER PUBLICATIONS

Huemoeller et al., U.S. Appl. No. 10/261,868, filed Oct. 1, 2002, entitled "Integrated Circuit Film Substrate Having Embedded Conductive Patterns and Vias".

*Primary Examiner*—Lex Malsawma
(74) *Attorney, Agent, or Firm*—Gunnison, McKay & Hodgson, L.L.P.; Serge J. Hodgson

(57) ABSTRACT

A method of forming an electronic component package includes: forming electrically conductive traces for connecting first selected bond pads of a plurality of bond pads on a first surface of an electronic component to corresponding bonding locations formed on a second surface of the electronic component; coupling the first surface of the electronic component to a first surface of a lower dielectric strip; coupling the second surface of the electronic component to a first surface of an upper dielectric strip; forming lower via apertures through the lower dielectric strip to expose second selected bond pads of the plurality of bond pads on the first surface of the electronic component; forming upper via apertures through the upper dielectric strip to expose the bonding locations on the second surface of the electronic component; filling the lower and upper via apertures with an electrically conductive material to form lower and upper vias electrically coupled to the first and second selected bond pads of the plurality of bond pads on the first surface of the electronic component.

12 Claims, 26 Drawing Sheets

U.S. PATENT DOCUMENTS

| | | |
|---|---|---|
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,964 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,394,303 A * | 2/1995 | Yamaji .................. 361/749 |
| 5,406,124 A | 4/1995 | Morita et al. |
| 5,410,180 A | 4/1995 | Fuji et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hofmeyer et al. |
| 5,770,888 A | 6/1998 | Song et al. |
| 5,776,798 A | 7/1998 | Quan et al. |
| 5,783,861 A | 7/1998 | Son |
| 5,786,238 A | 7/1998 | Pai et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,841,193 A | 11/1998 | Eichelberger .............. 257/723 |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |

| | | |
|---|---|---|
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,937,324 A | 8/1999 | Abercrombie et al. ...... 438/648 |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So ............................ 438/401 |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,521,530 B2 | 2/2003 | Peters et al. |
| 6,524,885 B2 | 2/2003 | Pierce |
| 6,534,849 B1 | 3/2003 | Gang |
| 6,545,332 B2 | 4/2003 | Huang |
| 6,545,345 B2 | 4/2003 | Glenn et al. |
| 6,559,525 B2 | 5/2003 | Huang |
| 6,566,168 B2 | 5/2003 | Gang |
| 6,583,503 B2 | 6/2003 | Akram et al. |
| 6,593,645 B2 | 7/2003 | Shih et al. |
| 6,603,196 B2 | 8/2003 | Lee et al. |
| 6,624,005 B1 | 9/2003 | DiCaprio et al. |
| 6,667,546 B2 | 12/2003 | Huang et al. |
| 6,671,398 B2 | 12/2003 | Reinhorn et al. |

| | | | | | | |
|---|---|---|---|---|---|---|
| 6,727,576 | B2 | 4/2004 | Hedler et al. ............... 257/678 | JP | 63-033854 | 2/1988 |
| 6,831,371 | B1 | 12/2004 | Huemoeller et al. | JP | 63-067762 | 3/1988 |
| 6,838,776 | B2 | 1/2005 | Leal et al. .................. 257/783 | JP | 63-188964 | 8/1988 |
| 6,845,554 | B2 | 1/2005 | Frankowsky et al. ......... 29/832 | JP | 63-205935 | 8/1988 |
| 6,905,914 | B1 | 6/2005 | Huemoeller et al. | JP | 63-233555 | 9/1988 |
| 6,921,975 | B2 | 7/2005 | Leal et al. .................. 257/723 | JP | 63-249345 | 10/1988 |
| 6,930,256 | B1 | 8/2005 | Huemoeller et al. | JP | 63-289951 | 11/1988 |
| 7,015,075 | B2 | 3/2006 | Fay et al. ................... 438/127 | JP | 63-316470 | 12/1988 |
| 7,041,534 | B2 | 5/2006 | Chao et al. ................. 438/114 | JP | 64-054749 | 3/1989 |
| 2001/0008305 | A1 | 7/2001 | McLellan et al. | JP | 01-106456 | 4/1989 |
| 2001/0011654 | A1 | 8/2001 | Schmidt et al. | JP | 01-175250 | 7/1989 |
| 2001/0014538 | A1 | 8/2001 | Kwan et al. | JP | 01-205544 | 8/1989 |
| 2002/0024122 | A1 | 2/2002 | Jung et al. | JP | 01-251747 | 10/1989 |
| 2002/0027297 | A1 | 3/2002 | Ikenaga et al. | JP | 02-129948 | 5/1990 |
| 2002/0061642 | A1 | 5/2002 | Haji et al. | JP | 03-069248 | 7/1991 |
| 2002/0140061 | A1 | 10/2002 | Lee | JP | 03-177060 | 8/1991 |
| 2002/0140068 | A1 | 10/2002 | Lee et al. | JP | 04-098864 | 3/1992 |
| 2002/0163015 | A1 | 11/2002 | Lee et al. | JP | 05-129473 | 5/1993 |
| 2003/0013232 | A1 | 1/2003 | Towle et al. ............... 438/113 | JP | 05-166992 | 7/1993 |
| 2003/0030131 | A1 | 2/2003 | Lee et al. | JP | 05-283460 | 10/1993 |
| 2003/0073265 | A1 | 4/2003 | Hu et al. | JP | 06-092076 | 4/1994 |
| 2003/0134455 | A1 | 7/2003 | Cheng et al. | JP | 06-140563 | 5/1994 |
| 2004/0056277 | A1 | 3/2004 | Karnezos | JP | 06-260532 | 9/1994 |
| 2004/0061212 | A1 | 4/2004 | Karnezos | JP | 07-297344 | 11/1995 |
| 2004/0061213 | A1 | 4/2004 | Karnezos | JP | 07-312405 | 11/1995 |
| 2004/0063242 | A1 | 4/2004 | Karnezos | JP | 08-064634 | 3/1996 |
| 2004/0063246 | A1 | 4/2004 | Karnezos | JP | 08-083877 | 3/1996 |
| 2005/0242425 | A1 | 11/2005 | Leal et al. .................. 257/690 | JP | 08-125066 | 5/1996 |
| 2005/0282314 | A1 | 12/2005 | Lo et al. ..................... 438/117 | JP | 08-222682 | 8/1996 |
| | | | | JP | 08-306853 | 11/1996 |
| | | FOREIGN PATENT DOCUMENTS | | JP | 09-008205 | 1/1997 |
| EP | | 0 393 997 | 10/1990 | JP | 09-008206 | 1/1997 |
| EP | | 0 459 493 | 12/1991 | JP | 09-008207 | 1/1997 |
| EP | | 0 720 225 | 7/1996 | JP | 09-092775 | 4/1997 |
| EP | | 0 720 234 | 7/1996 | JP | 09-293822 | 11/1997 |
| EP | | 0 794 572 | 9/1997 | JP | 10-022447 | 1/1998 |
| EP | | 0 844 665 | 5/1998 | JP | 10-163401 | 6/1998 |
| EP | | 0 936 671 | 8/1999 | JP | 10-199934 | 7/1998 |
| EP | | 0 989 608 | 3/2000 | JP | 10-256240 | 9/1998 |
| EP | | 1 032 037 | 8/2000 | JP | 2000-150765 | 5/2000 |
| JP | | 55-163868 | 12/1980 | JP | 2000-556398 | 10/2000 |
| JP | | 57-045959 | 3/1982 | JP | 2001-060648 | 3/2001 |
| JP | | 59-208756 | 11/1984 | JP | 2002-043497 | 2/2002 |
| JP | | 59-227143 | 12/1984 | KR | 1994-0001979 | 1/1994 |
| JP | | 60-010756 | 1/1985 | KR | 10-0220154 | 6/1999 |
| JP | | 60-116239 | 6/1985 | KR | 2002-0049944 | 6/2002 |
| JP | | 60-195957 | 10/1985 | WO | WO 99/56316 | 11/1999 |
| JP | | 60-231349 | 11/1985 | WO | WO 99/67821 | 12/1999 |
| JP | | 61-039555 | 2/1986 | | | |
| JP | | 62-009639 | 1/1987 | * cited by examiner | | |

TWO-SIDED WAFER ESCAPE PACKAGE

RELATED APPLICATIONS

The present application is a continuation-in-part of commonly assigned U.S. patent application Ser. No. 10/291,050, entitled "WAFER LEVEL PACKAGE AND FABRICATION METHOD", filed Nov. 8, 2002 now U.S. Pat. No. 6,905,914, issued Jun. 14, 2005, in the name of the inventors Ronald Patrick Huemoeller, Sukianto Rusli (name legally changed to Russ Lie) and David Razu, now U.S. Pat. No. 6,905,914, issued Jun. 14, 2005.

BACKGROUND

1. Field

The present invention relates generally to the packaging of electronic components. More particularly, the present invention relates to a wafer level package and method of fabricating the same.

2. Description of Related Art

One form of an electronic component package included an electronic component such as an integrated circuit chip mounted to a substrate. For example, in a wirebond configuration, the rear surface of the integrated circuit chip was mounted to the substrate, e.g., with an adhesive. Bond wires were used to form the electrical interconnections between the bond pads on the front surface of the integrated circuit chip and the electrically conductive traces on the substrate.

As the art moved to smaller and lighter weight electronic devices, it became increasingly important that the size of the electronic component package used within these electronic devices be as small as possible. However, in the wirebond configuration described above, the traces of the substrate were fanned out around the integrated circuit chip, which placed a fundamental restriction on the minimum electronic component package size. Further, a large impedance was associated with the bond wires.

To allow a further reduction in the electronic component package size as well as to reduce impedance of the interconnections, a flip chip configuration was used instead of a wirebond configuration. In a flip chip configuration, the bond pads on the front surface of the integrated circuit chip were directly connected to the traces on the substrate with flip chip bumps, e.g., solder. This avoided the need to fan out the traces around the integrated circuit chip resulting in a minimum package size. Further, the use of flip chip bumps between the bond pads and the traces on the substrate minimized impedance.

However, the flip chip bumps between the bond pads of the integrated circuit chip and the traces on the substrate were subject to significant stress, e.g., due to differential thermal expansion between the integrated circuit chip and the substrate. Thus, failure of the flip chip bumps often occurred which, in turn, decreased yield and increased the cost of the electronic component package.

To minimize the failure of the flip chip bumps, an underfill material was often applied between the integrated circuit chip and the substrate and around the flip chip bumps. However, the application of the underfill material required an additional manufacturing step and materials, which increased the cost of the electronic component package.

SUMMARY

In accordance with one embodiment of the present invention, a method of forming an electronic component package includes coupling a first surface of an electronic component to a first surface of a first dielectric strip, the electronic component comprising bond pads on the first surface; forming first via apertures through the first dielectric strip to expose the bond pads; and filling the first via apertures with an electrically conductive material to form first vias electrically coupled to the bond pads.

Thus, in accordance with this embodiment of the present invention, the bond pads are directly connected to the corresponding first vias. Stated another way, the bond pads are electrically connected to the corresponding first vias without the use of a solder, e.g., without the use of flip chip bumps, and without the need to form a solder wetting layer, e.g., a nickel/gold layer, on the bond pads. This maximizes the reliability of the electrical connection between the first vias and the bond pads, while at the same time minimizes impedance.

Further, since the dielectric strip is directly attached to the electronic component and the bond pads are directly connected to the corresponding first vias, the use of an underfill material is obviated. This simplifies manufacturing, enhances reliability, and thus reduces cost.

In accordance with another embodiment of the present invention, a method of forming an electronic component package includes: forming electrically conductive traces for connecting first selected bond pads of a plurality of bond pads on a first surface of an electronic component to corresponding bonding locations formed on a second surface of the electronic component; coupling the first surface of the electronic component to a first surface of a lower dielectric strip; coupling the second surface of the electronic component to a first surface of an upper dielectric strip; forming lower via apertures through the lower dielectric strip to expose second selected bond pads of the plurality of bond pads on the first surface of the electronic component; forming upper via apertures through the upper dielectric strip to expose the bonding locations on the second surface of the electronic component; filling the lower via apertures with an electrically conductive material to form lower vias electrically coupled to the second selected bond pads of the plurality of bond pads on the first surface of the electronic component; filling the upper via apertures with an electrically conductive material to form upper vias electrically coupled to the bonding locations on the second surface of the electronic component.

Thus, in accordance with this embodiment of the present invention, the second selected bond pads of the plurality of bond pads on the first surface of the electronic component are directly connected to the corresponding first vias and the first selected bond pads of the plurality of bond pads on the first surface of the electronic component are connected to the corresponding second vias through the electrically conductive traces and the bonding locations on the second surface of the electronic component.

Stated another way, the bond pads are electrically connected to the corresponding first vias and second vias without the use of a solder, e.g., without the use of flip chip bumps, and without the need to form a solder wetting layer, e.g., a nickel/gold layer, on the bond pads. This maximizes the reliability of the electrical connection between the first vias, second vias and the bond pads, while at the same time minimizes impedance and the size of the resulting package.

Further, since the dielectric strip is directly attached to the electronic component and the bond pads are directly connected to the corresponding first vias and second vias, the use of an underfill material is obviated. This simplifies manufacturing, enhances reliability, and thus reduces cost.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 5:
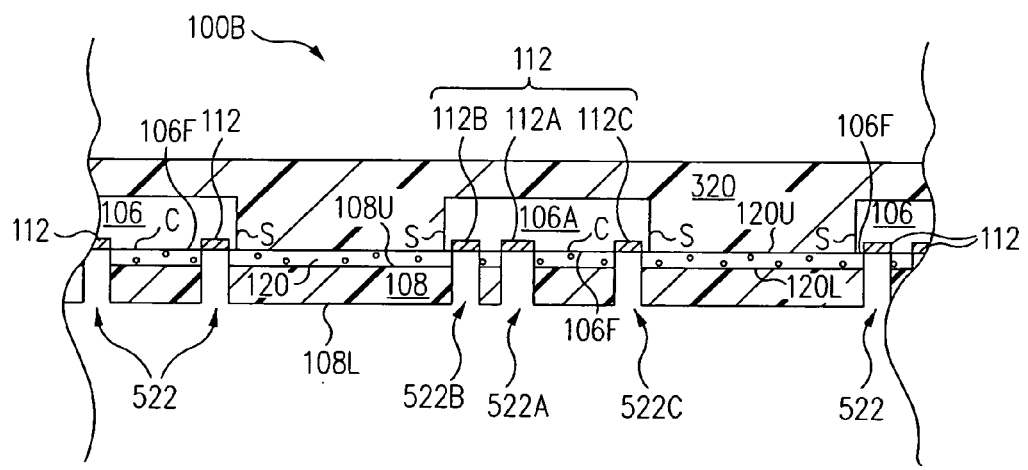
Figure 6:
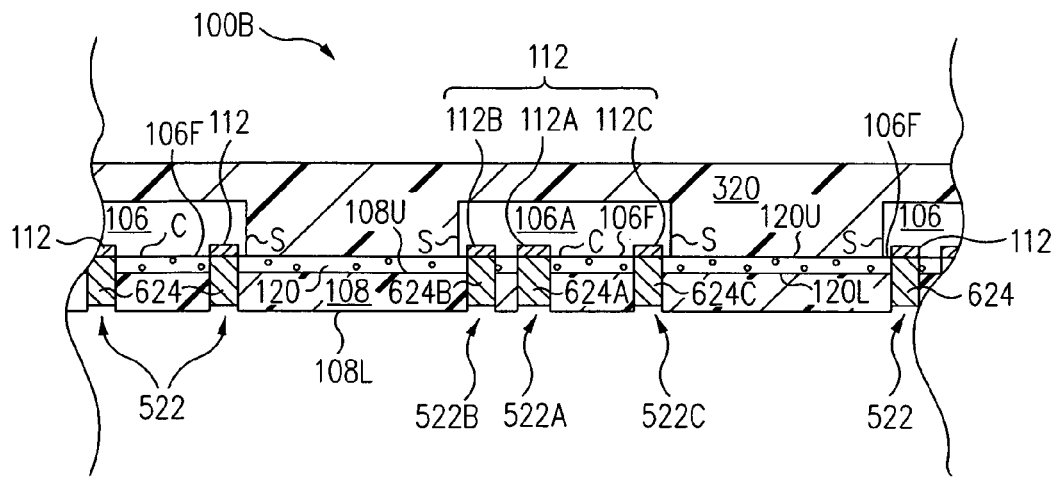

In accordance with one embodiment of the present invention, a method of forming an electronic component package includes coupling first surfaces 106F of electronic components 106 to a first surface 108U of a dielectric strip 108 with adhesives 110 or 120 (FIGS. 1A and 1B), electronic components 106 having bond pads 112 on first surfaces 106F; forming via apertures 522 through dielectric strip 108 to expose bond pads 112 (FIG. 5); and filling via apertures 522 with an electrically conductive material to form vias 624 electrically coupled to bond pads 112 (FIG. 6).

Thus, in accordance with this embodiment of the present invention, bond pads 112 are directly connected to corresponding vias 624. Stated another way, bond pads 112 are electrically connected to corresponding vias 624 without the use of a solder, e.g., without the use of flip chip bumps, and without the need to form a solder wetting layer, e.g., a nickel/gold layer, on bond pads 112. This maximizes the reliability of the electrical connection between vias 624 and bond pads 112, while at the same time minimizes impedance.

In accordance with another embodiment of the present invention, a method of forming an electronic component package includes: forming electrically conductive traces (1401B and 1401C in FIG. 14A) connecting first selected bond pads (1412B and 1412C in FIG. 14A) of a plurality of bond pads on a first surface (1406F in FIG. 14A) of an electronic component (1406 in FIG. 14A) to corresponding bonding locations (1413B in FIG. 14A) formed on a second surface (1406B in FIG. 14A) of the electronic component; coupling the first surface of the electronic component to a first surface (1408AU in FIG. 14B) of a first lower dielectric strip (1408A in FIG. 14B); coupling the second surface of the electronic component to a first surface (1408BU in FIG. 15) of a first upper dielectric strip (1408B in FIG. 15); forming first lower via apertures (1722 in FIG. 17) through the first lower dielectric strip to expose second selected bond pads (1412A in FIG. 17) of the plurality of bond pads (1412 in FIG. 17) on the first surface of the electronic component; forming first upper via apertures (1822 in FIG. 18A) through the first upper dielectric strip to expose the bonding locations (1413 in FIG. 18A) on the second surface of the electronic component; filling the first lower via apertures with an electrically conductive material to form first lower vias (1724 in FIG. 18B) electrically coupled to the second selected bond pads of the plurality of bond pads on the first surface of the electronic component; filling the first upper via apertures with an electrically conductive material to form first upper vias (1824 in FIG. 18B) electrically coupled to the bonding locations on the second surface of the electronic component.

Thus, in accordance with this embodiment of the present invention, the second selected bond pads of the plurality of bond pads on the first surface of the electronic component are directly connected to the corresponding first lower vias and the first selected bond pads of the plurality of bond pads on the first surface of the electronic component are connected to the corresponding first upper vias through the electrically conductive traces and the bonding locations on the second surface of the electronic component.

Stated another way, the bond pads are electrically connected to the corresponding first lower vias and first upper vias without the use of a solder, e.g., without the use of flip chip bumps, and without the need to form a solder wetting layer, e.g., a nickel/gold layer, on the bond pads. This maximizes the reliability of the electrical connection between the first lower vias, first upper vias and the bond pads, while at the same time minimizes impedance and the size of the resulting package.

Further, since the dielectric strip is directly attached to the electronic component and the bond pads are directly connected to the corresponding first lower and upper vias, the use of an underfill material is obviated. This simplifies manufacturing, enhances reliability, and thus reduces cost.

Figure 1A:
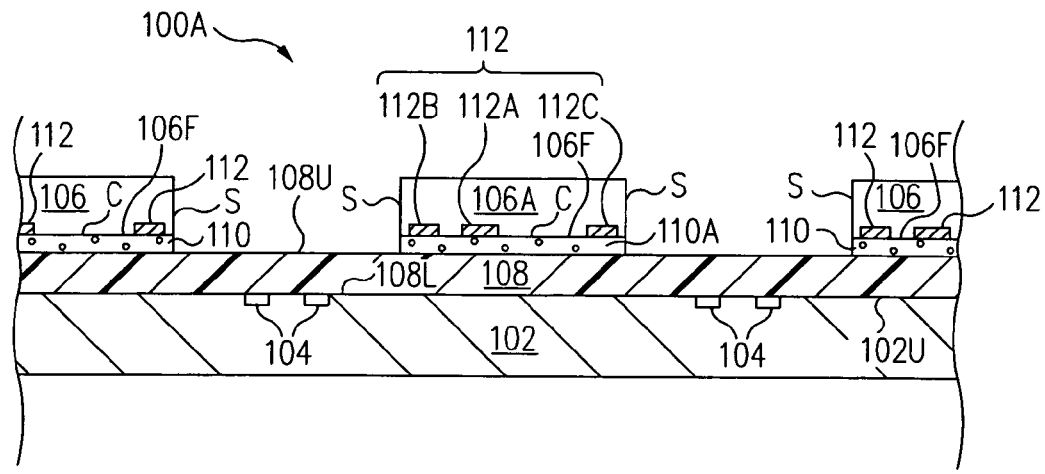
FIG. 1A is a cross-sectional view of an assembly during the fabrication of a plurality of wafer level electronic component packages in accordance with one embodiment of the present invention.

More particularly, FIG. 1A is a cross-sectional view of an assembly 100A during the fabrication of a plurality of wafer level electronic component packages in accordance with one embodiment of the present invention. Referring now to FIG. 1A, assembly 100A includes a rigid support strip 102, e.g., an aluminum, copper or stainless steel plate. Support strip 102 includes fiducials 104 on an upper, e.g., first, surface 102U of support strip 102. Fiducials 104 are used for alignment and mounting of electronic components 106, e.g., integrated circuit chips, as discussed further below.

A dielectric strip 108 is mounted to support strip 102. Electronic components 106 are mounted to dielectric strip 108 with adhesives 110, e.g., liquid adhesives or double-sided sticky tapes, although other adhesives are used in other embodiments. To illustrate, a first electronic component 106A of the plurality of electronic components 106 is mounted to dielectric strip 108 with a first adhesive 110A of the plurality of adhesives 110. Dielectric strip 108, sometimes called a first dielectric strip, and adhesives 110 are electrical insulators, i.e., dielectrics.

More particularly, front, e.g., first, surfaces 106F of electronic components 106 are mounted to an upper, e.g., first, surface 108U of dielectric strip 108 with adhesives 110. A lower, e.g., second, surface 108L of dielectric strip 108 is mounted to upper surface 102U of support strip 102. For example, dielectric strip 108 is tacky, sometimes called sticky, and is simply pressed against support strip 102 to mount dielectric strip 108 to support strip 102.

In one embodiment, adhesives 110 are applied to front surfaces 106F of electronic components 106 while electronic components 106 are still in wafer form, i.e., before they are singulated.

In one embodiment, dielectric strip 108 is transparent such that fiducials 104 are visible through dielectric strip 108. Electronic components 106 are aligned to fiducials 104 and mounted to dielectric strip 108 with adhesives 110, e.g., using an optical alignment system. Adhesives 110 are cured, if necessary.

In one embodiment, electronic components 106 are mounted in a single row on dielectric strip 108. However, in other embodiments, electronic components 106 are mounted in an array on dielectric strip 108. Illustratively, electronic components 106 are mounted in a 2×2, 3×3, . . . , or n×m array. In yet another embodiment, only a single electronic component 106 is mounted to dielectric strip 108, i.e., the wafer level electronic component package is fabricated as an individual unit instead of as one of a plurality of units fabricated simultaneously.

Formed on front surface 106F of electronic components 106 are bond pads 112, e.g., formed of aluminum. Bond pads 112 are connected to the internal circuitry of electronic components 106.

In one embodiment, bond pads 112 are distributed in an array on front surface 106F. In another embodiment, bond pads 112 are formed on front surface 106F directly adjacent sides S of electronic components 106 in a typical wirebond configuration pattern.

Figure 1B:
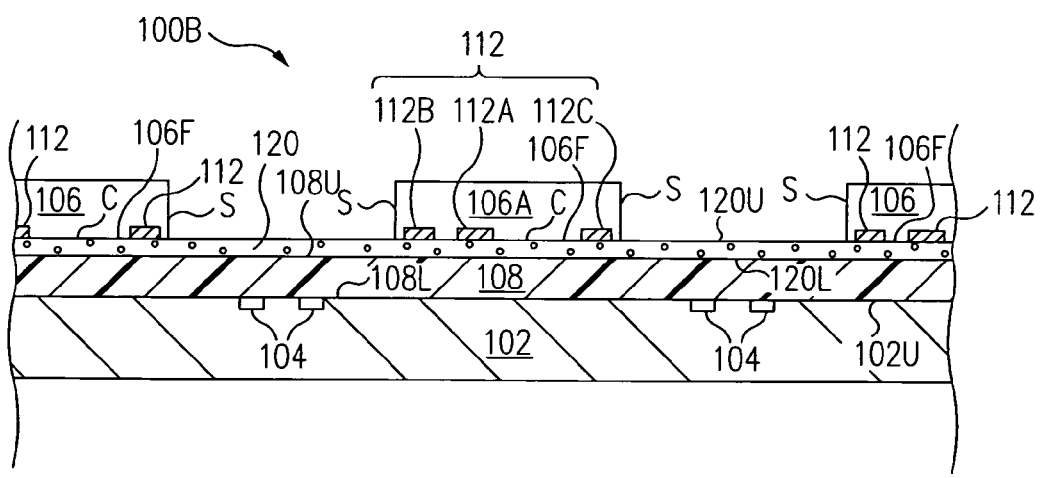
FIG. 1B is a cross-sectional view of an assembly during the fabrication of a plurality of wafer level electronic component packages in accordance with another embodiment of the present invention.

FIG. 1B is a cross-sectional view of an assembly 100B during the fabrication of a plurality of wafer level electronic component packages in accordance with another embodiment of the present invention. Assembly 100B of FIG. 1B is similar to assembly 100A of FIG. 1A and only the significant differences are discussed below.

Referring now to FIGS. 1A and 1B together, instead of mounting electronic components 106 to dielectric strip 108 using individual adhesives 110 as illustrated in FIG. 1A, an adhesive strip 120 (FIG. 1B) is used to mount electronic components 106.

Adhesive strip 120 is an electrical insulator. Illustratively, adhesive strip 120 is a liquid adhesive, for example, applied by spin coating. As another example, adhesive strip 120 is a double-sided sticky tape although other adhesives are used in other embodiments.

More particularly, a lower, e.g., first, surface 120L of adhesive strip 120 is mounted to upper surface 108U of dielectric strip 108. Front surfaces 106F of electronic components 106 are mounted to an upper, e.g., second, surface 120U of adhesive strip 120. Although use of adhesive strip 120 is illustrated in the figures that follow and discussed below for purposes of simplicity, it is to be understood that adhesives 110 (FIG. 1A) are used instead of adhesive strip 120 in an alternative embodiment.

Figure 2:
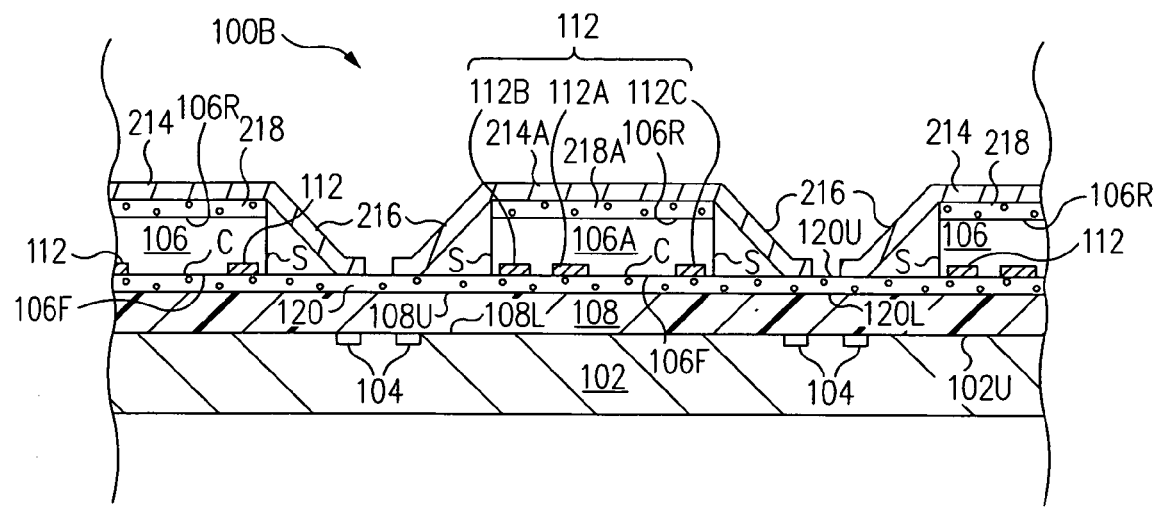
FIGS. 2, 3, 4, 5, 6, 7, 8, 9, 10 and 11 are cross-sectional views of the assembly of FIG. 1B at further stages during the fabrication of a plurality of wafer level electronic component packages in accordance with various embodiments of the present invention.

FIG. 2 is a cross-sectional view of assembly 100B of FIG. 1B at a further stage during the fabrication of a plurality of wafer level electronic component packages in accordance with one embodiment of the present invention. Referring now to FIG. 2, heat sinks 214, e.g., copper slugs, are mounted to rear, e.g., second, surfaces 106R of electronic components 106. During use, heat sinks 214 enhance heat dissipation from electronic components 106 to the ambient environment.

To illustrate, a first heat sink 214A of the plurality of heat sinks 214 is mounted to rear surface 106R of electronic component 106A.

In one embodiment, legs 216 of heat sinks 214 adhere to adhesive strip 120 to hold heat sinks 214 in place. In accordance with one embodiment, a thermal pad or grease is used between heat sinks 214 and rear surfaces 106R of electronic components 106 to enhance heat transfer from electronic components 106 to heat sinks 214.

In another embodiment, adhesives 218, e.g., thermal adhesives having a relatively high heat transfer coefficient, mount heat sinks 214 to rear surface 106R of electronic components 106. To illustrate, heat sink 214A is mounted to rear surface 106R of electronic component 106A with a first adhesive 218A of the plurality of adhesives 218.

Although heat sinks 214 are not illustrated in the figures which follow or discussed further below for purposes of simplicity, it is to be understood that the assembly is fabricated to include heat sinks 214 in an alternative embodiment.

Figure 3:
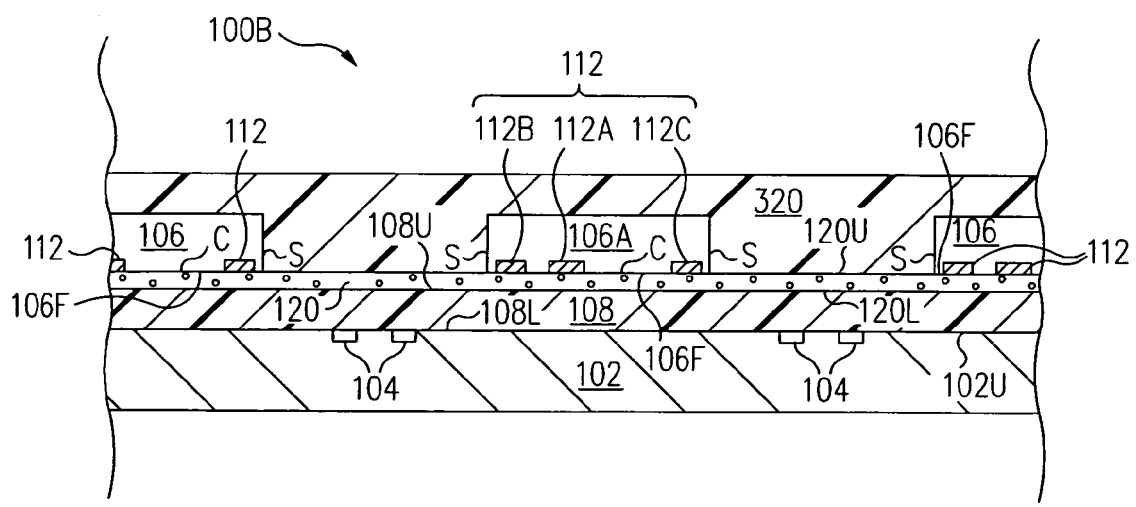

FIG. 3 is a cross-sectional view of assembly 100B of FIG. 1B at a further stage during the fabrication of a plurality of wafer level electronic component packages in accordance with one embodiment of the present invention. Referring now to FIG. 3, electronic components 106 are encapsulated, sometimes called overmolded, in an encapsulant 320. Encapsulant 320 protects electronic components 106 from the ambient environment.

Illustratively, a liquid encapsulant is applied and cured to form encapsulant 320. In another embodiment, a plastic encapsulant is applied, e.g., using a transfer or injection mold process, to form encapsulant 320.

Figure 4:
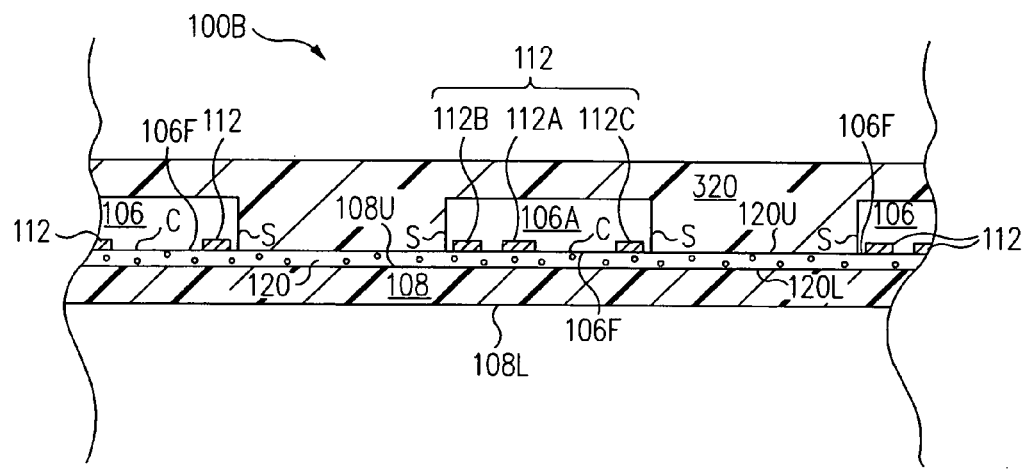

FIG. 4 is a cross-sectional view of assembly 100B of FIG. 3 at a further stage during the fabrication of a plurality of wafer level electronic component packages in accordance with one embodiment of the present invention. Referring now to FIGS. 3 and 4 together, support strip 102 is removed from dielectric strip 108. In one embodiment, upper surface 102U of support strip 102 is pretreated, e.g., a release agent is applied, to facilitate easy removal of support strip 102. In one embodiment, support strip 102 is reusable and thus reused to fabricate another assembly 100B as illustrated in FIG. 1B after removal from dielectric strip 108 thus minimizing the cost of fabricating assembly 100B.

Once support strip 102 is removed, encapsulant 320 provides rigidity and support for assembly 100B. Further, removal of support strip 102 exposes lower surface 108L of dielectric strip 108 for further processing as discussed further below.

FIG. 5 is a cross-sectional view of assembly 100B of FIG. 4 at a further stage during the fabrication of a plurality of wafer level electronic component packages in accordance with one embodiment of the present invention. Referring now to FIG. 5, a plurality of via apertures 522 are formed using a laser, i.e., using laser ablation. Via apertures 522 are sometimes called first via apertures.

Via apertures 522 extend through dielectric strip 108 and through adhesive strip 120 to bond pads 112 of electronic components 106. In one embodiment, via apertures 522 are cylindrical in shape. Bond pads 112 are exposed through via apertures 522.

In one embodiment, the laser intensity is set to be sufficient to remove dielectric strip 108 and adhesive strip 120. However, the laser intensity is set to be insufficient to remove bond pads 112. Accordingly, pulsing of the laser forms a single via aperture 522 extending through dielectric strip 108 and through adhesive strip 120 to a bond pad 112 of electronic components 106. The laser is then stepped to the next location to form the next via aperture 522.

To illustrate, electronic component 106A includes bond pads 112A, 112B, and 112C on front surface 106F of electronic component 106A. Via apertures 522A, 522B, 522C of the plurality of via apertures 522 extend through dielectric strip 108 and through adhesive strip 120 to bond pads 112A, 112B, 112C, respectively.

To further illustrate, initially, the laser is pulsed to form via aperture 522A. The laser is then stepped and pulsed again to form via aperture 522B. The laser is then stepped and pulsed again to form via aperture 522C. The laser is stepped and pulsed repeatedly until all of via apertures 522 are formed. However, in another embodiment, a plurality of lasers are simultaneous pulsed to form some or all of via apertures 522 simultaneously. In yet other embodiments, via apertures 522 are formed using selective etching, mechanical drilling, or other techniques.

FIG. 6 is a cross-sectional view of assembly 100B of FIG. 5 at a further stage during the fabrication of a plurality of wafer level electronic component packages in accordance with one embodiment of the present invention. Referring now to FIGS. 5 and 6 together, via apertures 522 are filled with an electrically conductive material, e.g., a metal or metal containing material, an electrically conductive adhesive such as a silver filled adhesive or polymer, or solder paste, to form electrically conductive vias 624. Vias 624 are sometimes called first vias.

In one embodiment, copper or a copper containing material is plated in via apertures 522 to form vias 624. In another embodiment, via apertures 522 are filled with an electrically conductive adhesive, which is then cured if necessary, to form vias 624. In yet another embodiment, via apertures 522 are filled with a solder paste. Assembly 100B is then heated to reflow the solder paste to form vias 624.

After formation of vias 624, any excess electrically conductive material formed on lower surface 108L of dielectric strip 108 is removed. Illustratively, an etch or physical grinding process is used.

In one embodiment, an over-etch process is used to slightly over-etch vias 624. Thus, vias 624 remain recessed within via apertures 522. This ensures that shorting between vias 624 from excess electrically conductive material is avoided.

Vias 624 are electrically connected to corresponding bond pads 112. To illustrate, vias 624A, 624B, 624C of the plurality of vias 624 are electrically connected to bond pads 112A, 112B, 112C, respectively. Vias 624 extend from bond pads 112, through adhesive strip 120 and through dielectric strip 108 to be adjacent or slightly recessed from (above in the view of FIG. 6) lower surface 108L of dielectric strip 108.

Bond pads 112 are directly connected to corresponding vias 624. Stated another way, bond pads 112 are electrically connected to corresponding vias 624 without the use of a solder, e.g., without the use of flip chip bumps, and without the need to form a solder wetting layer, e.g., a nickel/gold layer, on bond pads 112. This maximizes the reliability of the electrical connection between vias 624 and bond pads 112, while at the same time minimizes impedance.

Further, since dielectric strip 108 is directly attached to electronic components 106 by adhesive strip 120 and bond pads 112 are directly connected to corresponding vias 624, the use of an underfill material is obviated. This simplifies manufacturing, enhances reliability, and thus reduces cost.

After formation of vias 624, assembly 100B is inspected, e.g., optically using an automatic inspection system, to insure that all via apertures 522 are properly filled with electrically conductive material, i.e., to inspect the integrity of vias 624. In one embodiment, any defective or unformed vias 624 detected during the inspection are corrected, e.g., by etch removal of vias 624, reapplication of the electrically conductive material to reform vias 624, e.g., re-plating, and removal of any excess electrically conductive material on lower surface 108L of dielectric strip 108.

In this manner, the wafer level electronic component packages are fabricated with a maximum yield, e.g., essentially a 100 percent yield. This further minimizes the fabrication cost of the wafer level electronic component packages.

Figure 7:
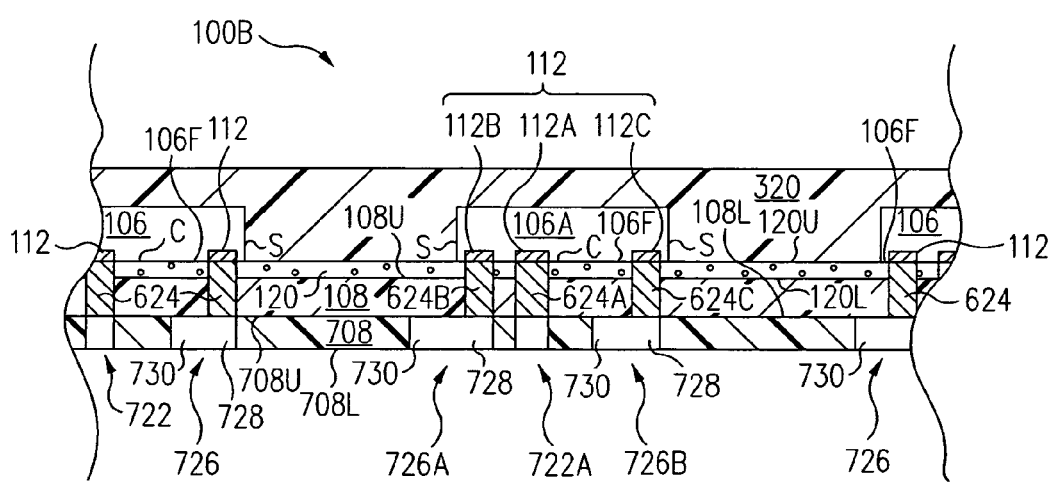

FIG. 7 is a cross-sectional view of assembly 100B of FIG. 6 at a further stage during the fabrication of a plurality of wafer level electronic component packages in accordance with one embodiment of the present invention. Referring now to FIG. 7, a second dielectric strip 708 is mounted to dielectric strip 108. More particularly, an upper, e.g., first, surface 708U of dielectric strip 708 is mounted to lower surface 108L of dielectric strip 108.

For example, dielectric strip 708 is mounted to dielectric strip 108 using a tack cure. More particularly, dielectric strip 708 is pressed on to dielectric strip 108. Assembly 100B is heated to fuse together and bond dielectric strip 708 to dielectric strip 108.

Illustratively, dielectric strip 108 and dielectric strip 708 are polytetrafluoroethylene (PTFE), liquid crystal polymer (LCP) or a non-woven arimid although other low-K dielectric materials are used in other embodiments.

A plurality of via apertures 722 and trace channels 726 are formed using a laser, i.e., using laser ablation. Via apertures 722 and trace channels 726 extend through dielectric strip 708 and to vias 624. Via apertures 722 are sometimes called second via apertures.

In one embodiment, via apertures 722 are cylindrical in shape and extend vertically, i.e., in a first direction perpendicular to front surface 106F of electronic components 106, through dielectric strip 708 to vias 624. Trace channels 726 are trenches extending horizontally, i.e., in a second direction perpendicular to the first direction and parallel to front surface 106F of electronic components 106, from vias 624.

Vias 624 are exposed through via apertures 722 and trace channels 726. To illustrate, a first via aperture 722A of the plurality of via apertures 722 extends through dielectric strip 708 to via 624A.

To further illustrate, a first trace channel 726A of the plurality of trace channels 726 extends through dielectric strip 708 to via 624B. More particularly, via 624B is exposed at a first end 728 of trace channel 726A. Trace channel 726A extends horizontally outwards from a center C of electronic component 106A and outwards from via 624B to a second end 730 of trace channel 726A in a fan-out configuration.

To further illustrate, a second trace channel 726B of the plurality of trace channels 726 extends through dielectric strip 708 to via 624C. More particularly, via 624C is exposed at a first end 728 of trace channel 726B. Trace channel 726B extends horizontally inwards toward center C from via 624C to a second end 730 of trace channel 726B in a fan-in configuration.

In one embodiment, a laser is stepped and pulsed repeatedly to form via apertures 722 and trace channels 726. However, in another embodiment, a plurality of lasers are simultaneous pulsed to form some or all of via apertures 722 and trace channels 726 simultaneously. During formation of trace channels 726, the laser is moved during pulsing to form the horizontal trenches of trace channels 726.

By controlling the laser intensity and pulse time, via apertures 722 and trace channels 726 are all formed to have the same depth, this depth being equal to the thickness of dielectric strip 708. This simplifies and enhances reliability of filling, e.g., plating, of via apertures 722 and trace channels 726 with an electrically conductive material as discussed below.

Figure 8:
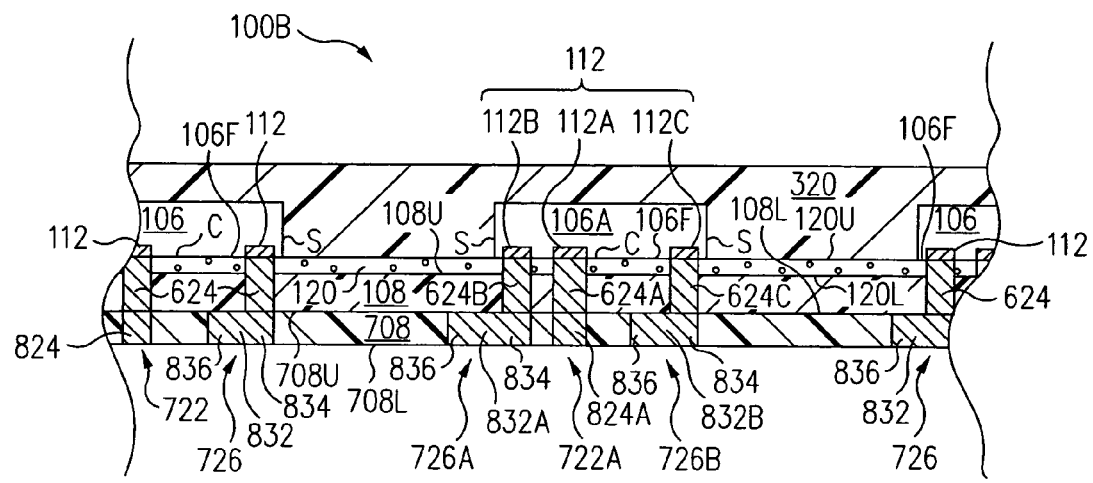

FIG. 8 is a cross-sectional view of assembly 100B of FIG. 7 at a further stage during the fabrication of a plurality of wafer level electronic component packages in accordance with one embodiment of the present invention. Referring now to FIGS. 7 and 8 together, via apertures 722 and trace channels 726 are filled with an electrically conductive material, e.g., a metal or metal containing material, an electrically conductive adhesive, or solder paste, to form electrically conductive vias 824 and electrically conductive traces 832, respectively. Vias 824 are sometimes called second vias.

In one embodiment, copper or a copper containing material is plated in via apertures 722 and trace channels 726 to form vias 824 and traces 832, respectively. In another embodiment, via apertures 722 and trace channels 726 are filled with an electrically conductive adhesive, which is then cured if necessary, to form vias 824 and traces 832, respectively. In yet another embodiment, via apertures 722 and trace channels 726 are filled with a solder paste. Assembly 100B is then heated to reflow the solder paste to form vias 824 and traces 832, respectively.

Vias 824 form vertical electrical connectors, i.e., form electrical connectors extending vertically. Traces 832 form horizontal electrical connectors, i.e., form electrical connectors extending horizontally.

After formation of vias 824 and traces 832, any excess electrically conductive material formed on a lower, e.g., second, surface 708L of dielectric strip 708 is removed. Illustratively, an etch or physical grinding process is used. In one embodiment, an over-etch process is used to slightly over-etch vias 824 and traces 832. This ensures that shorting between vias 824 and/or traces 832 from excess electrically conductive material is avoided.

Vias 824 and traces 832 are electrically connected to corresponding vias 624. To illustrate, a first via 824A of the plurality of vias 824 is electrically connected to via 624A. Vias 824 extend from vias 624, through dielectric strip 708 to be adjacent or recessed from lower surface 708L of dielectric strip 708.

To further illustrate, a first trace 832A of the plurality of traces 832 is electrically connected to via 624B. More particularly, a first end 834 of trace 832A is electrically connected to via 624B. Trace 832A extends horizontally outwards from a center C of electronic component 106A and outwards from via 624B to a second end 836 of trace 832A in a fan-out configuration.

To further illustrate, a second trace 832B of the plurality of traces 832 is electrically connected to via 624C. More particularly, a first end 834 of trace 832B is electrically connected to via 624C. Trace 832B extends horizontally inwards toward center C from via 624C to a second end 836 of trace 832B in a fan-in configuration.

Although a fan-out trace and a fan-in trace, i.e., traces 832A, 832B, respectively, are illustrated and discussed, in other embodiments, only fan-in traces or fan-out traces are formed.

After formation of vias 824 and traces 832, assembly 100B is inspected to insure that all via apertures 722 and trace channels 726 are properly filled with electrically conductive material, i.e., to inspect the integrity of vias 824 and traces 832.

In one embodiment, any defective or unformed vias 824 and traces 832 detected during the inspection are corrected, e.g., by etch removal of vias 824 and traces 832, reapplication of the electrically conductive material to reform vias 824 and traces 832, and removal of any excess electrically conductive material on lower surface 708L of dielectric strip 708. In this manner, the wafer level electronic component packages are fabricated with a maximum yield.

Figure 9:
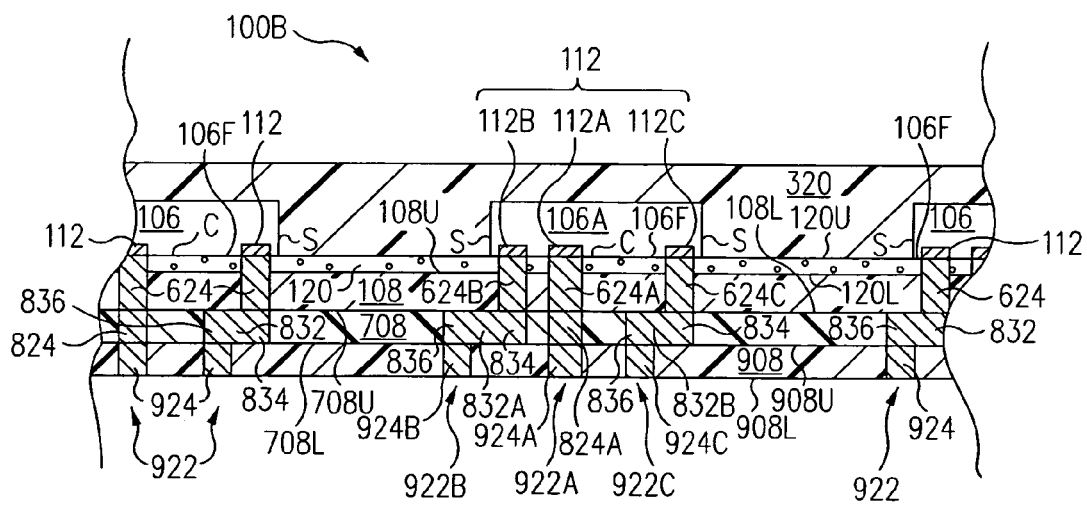

FIG. 9 is a cross-sectional view of assembly 100B of FIG. 8 at a further stage during the fabrication of a plurality of wafer level electronic component packages in accordance with one embodiment of the present invention. Referring now to FIG. 9, a third dielectric strip 908 is mounted to dielectric strip 708. More particularly, an upper, e.g., first, surface 908U of dielectric strip 908 is mounted to lower surface 708L of dielectric strip 708. Dielectric strip 908 is similar to dielectric strip 708 and mounted in a manner similar to that discussed above with regards to mounting of dielectric strip 708 to dielectric strip 108.

A plurality of via apertures 922 are formed using a laser, i.e., using laser ablation. Via apertures 922 extend through dielectric strip 908 to vias 824 and traces 832. In one embodiment, via apertures 922 are cylindrical in shape. Via apertures 922 are sometimes called third via apertures.

Vias 824 and second ends 836 of traces 832 are exposed through via apertures 922. To illustrate, via apertures 922A, 922B, 922C of the plurality of via apertures 922 extend through dielectric strip 908 to via 824A and second ends 836 of traces 832A, 832B, respectively.

Via apertures 922 are formed in a manner similar to via apertures 522 of FIG. 5 so formation of via apertures 922 is not discussed in detail to avoid detracting from the principals of the invention.

Via apertures 922 are filled with an electrically conductive material, e.g., a metal or metal containing material, an electrically conductive adhesive, or solder paste, to form electrically conductive vias 924. Via apertures 922 are filled to form vias 924 in a manner similar to that discussed with regards to vias 624 of FIG. 6 so formation of vias 924 is not discussed in detail to avoid detracting from the principals of the invention. Vias 924 are sometimes called third vias.

After formation of vias 924, any excess electrically conductive material formed on a lower, e.g., second, surface 908U of dielectric strip 908 is removed. Illustratively, an etch or physical grinding process is used. In one embodiment, an over-etch process is used to slightly over-etch vias 924. Thus, vias 924 remain recessed within via apertures 922. This ensures that shorting between vias 924 from excess electrically conductive material is avoided.

Vias 924 are electrically connected to corresponding vias 824 and second ends 836 of traces 832. To illustrate, vias 924A, 924B, 924C of the plurality of vias 924 are electrically connected to via 824A and second ends 836 of traces 832A, 832B, respectively. Vias 924 extend from vias 824 and second ends 836 of traces 832 through dielectric strip 908 to be adjacent or slightly recessed from lower surface 908L of dielectric strip 908.

In one embodiment, vias 924 are formed to have a larger diameter than the width of traces 832 and/or the diameter of vias 824. By forming vias 924 with the appropriate diameter, tolerance in the positioning of vias 924 is accommodated. Stated another way, by forming vias 924 with a sufficiently large diameter, electrical contact between vias 924 and vias 824/traces 832 is assured.

After formation of vias 924, assembly 100B is inspected to insure that all via apertures 922 are properly filled with electrically conductive material, i.e., to inspect the integrity of vias 924.

In one embodiment, any defective or unformed vias 924 detected during the inspection are corrected, e.g., by etch removal of vias 924, reapplication of the electrically conductive material to reform vias 924, and removal of any excess electrically conductive material on lower surface 908L of dielectric strip 908. In this manner, the wafer level electronic component packages are fabricated with a maximum yield.

Figure 10:
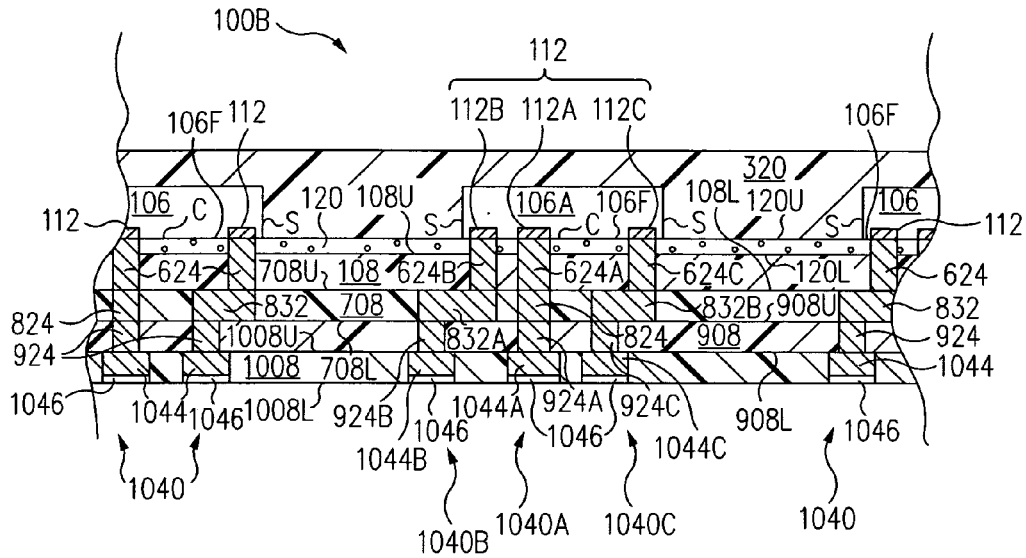

FIG. 10 is a cross-sectional view of assembly 100B of FIG. 9 at a further stage during the fabrication of a plurality of wafer level electronic component packages in accordance with one embodiment of the present invention. Referring now to FIG. 10, a fourth dielectric strip 1008 is mounted to dielectric strip 908. More particularly, an upper, e.g., first, surface 1008U of dielectric strip 1008 is mounted to lower surface 908L of dielectric strip 908. Dielectric strip 1008 is similar to dielectric strip 708 and mounted in a manner similar to that discussed above with regards to mounting of dielectric strip 708 to dielectric strip 108.

A plurality of land apertures 1040 are formed using a laser, i.e., using laser ablation. Land apertures 1040 extend through dielectric strip 1008 to vias 924. In one embodiment, land apertures 1040 are cylindrical in shape but can be patterned in a variety of shapes depending upon the particular interconnection structure used, e.g., interconnection balls or lands.

Vias 924 are exposed through land apertures 1040. To illustrate, land apertures 1040A, 1040B, 1040C of the plurality of land apertures 1040 extend through dielectric strip 1008 to vias 924A, 924B, 924C, respectively.

Land apertures 1040 are formed in a manner similar to via apertures 522 of FIG. 5 so formation of land apertures 1040 is not discussed in detail to avoid detracting from the principals of the invention. Land apertures 1040 are filled with an electrically conductive material, e.g., a metal or metal containing material, an electrically conductive adhesive, or solder paste, to form electrically conductive lands 1044. Land apertures 1040 are filled to form lands 1044 in a manner similar to that discussed with regards to vias 624 of FIG. 6 so formation of lands 1044 is not discussed in detail to avoid detracting from the principals of the invention.

After formation of lands 1044, any excess electrically conductive material formed on a lower, e.g., second, surface 1008L of dielectric strip 1008 is removed. Illustratively, an etch or physical grinding process is used.

In one embodiment, an over-etch process is used to slightly over-etch lands 1044. Thus, lands 1044 remain recessed within land apertures 1040. This ensures that shorting between lands 1044 from excess electrically conductive material is avoided.

Lands 1044 are electrically connected to corresponding vias 924. To illustrate, lands 1044A, 1044B, 1044C of the plurality of lands 1044 are electrically connected to vias 924A, 924B, 924C, respectively. Lands 1044 extend from vias 924 through dielectric strip 1008 to be adjacent or slightly recessed from lower surface 1008L of dielectric strip 1008.

After formation of lands 1044, assembly 100B is inspected to insure that all land apertures 1040 are properly filled with electrically conductive material, i.e., to inspect the integrity of lands 1044. In one embodiment, any defective or unformed lands 1044 detected during the inspection are corrected, e.g., by etch removal of lands 1044, reapplication of the electrically conductive material to reform lands 1044, and removal of any excess electrically conductive material on lower surface 1008L of dielectric strip 1008. In this manner, the wafer level electronic component packages are fabricated with a maximum yield.

After formation of lands 1044, in one embodiment, a solder on paste (SOP) is applied to lands 1044. This solder on paste is reflowed, i.e., heated to a melt and cooled to resolidify, to form solder lands, which are represented as item 1046 in FIG. 10 in accordance with this embodiment.

In accordance with this embodiment, the resulting wafer level electronic component package is a land grid array package. The solder lands are used to electrically connect the wafer level electronic component package to the larger substrate, e.g., a mother or daughter board, for example, using a high lead solder such as a 90/10 lead/tin solder.

In another embodiment, a ball grid array package is formed. More particular, after formation of lands 1044, an organic solderability protectant (OSP), sometimes called an organic solderability preservative, is applied to lands 1044. The organic solderability protectant, which is represented as item 1046 in FIG. 10 in accordance with this embodiment, enhances the solder wet-ability of lands 1044. For simplicity of discussion, the organic solderability protectant is hereinafter referred to as OSP 1046. However, in another embodiment, OSP 1046 is not used.

Figure 11:
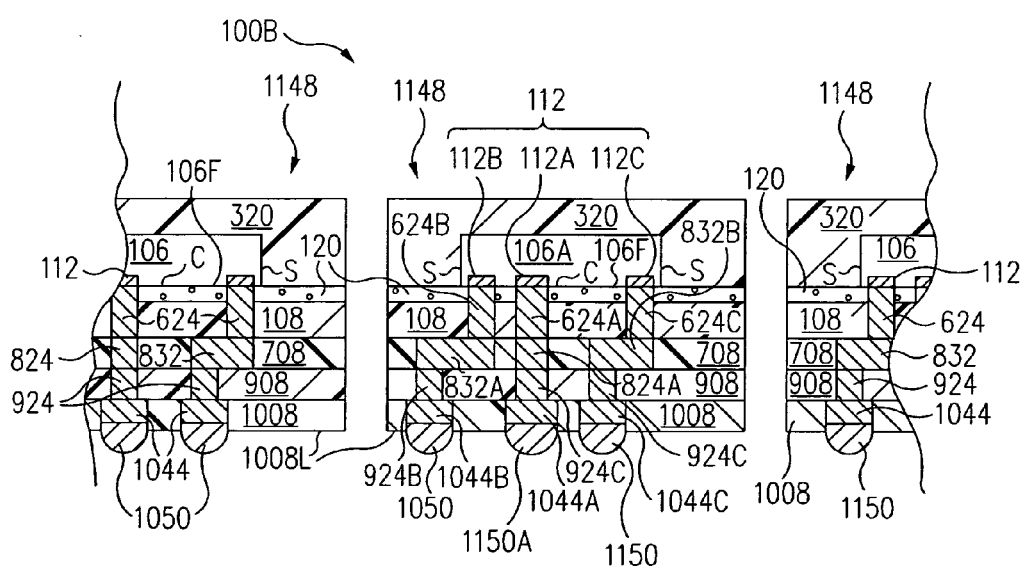

FIG. 11 is a cross-sectional view of assembly 100B of FIG. 10 at a further stage during the fabrication of a plurality of wafer level electronic component packages 1148 in accordance with one embodiment of the present invention. Referring now to FIG. 11, electrically conductive interconnection balls 1150, e.g., eutectic lead/tin solder, are formed on lands 1044. Interconnection balls 1150 are formed in a conventional manner. During formation of interconnection balls 1150, OSP 1046 is consumed.

Interconnection balls 1150 are used to electrically connect wafer level electronic component packages 1148 to the larger substrate, e.g., a mother or daughter board. Assembly 100B is then singulated, e.g., using a mechanical saw or laser, to form the plurality of wafer level electronic component packages 1148.

Each interconnection ball 1150 is electrically connected to a corresponding bond pad 112 as discussed above. In this manner, the pattern of bond pads 112 is redistributed to the pattern of interconnection balls 1150.

For example, bond pads 112 are formed on front surface 106F directly adjacent sides S of electronic components 106 in a typical wirebond configuration pattern. However, interconnection balls 1150 are distributed in an array pattern.

Thus, the wirebond configuration pattern of bond pads 112 is redistributed to an array pattern of interconnection balls 1150. Although an array pattern of interconnection balls 1150 is discussed above, interconnection balls 1150 are distributed in any one of a number of desired patterns in other embodiments.

Further, interconnection balls 1150 are connected to bond pads 112 using a minimum path length. To illustrate, bond pad 112A is coupled to a first interconnection ball 1150A of the plurality of interconnection balls 1150 by vias 624A, 824A, 924A, land 1044A, which are directly aligned with one another. By using a minimum path length, heat transfer between bond pads 112 and more generally between electronic components 106 and interconnection balls 1150 is maximized thus improving the thermal performance of wafer level electronic component packages 1148. For similar reasons, impedance between bond pads 112 and interconnection balls 1150 is minimized.

As set forth above, (1) a dielectric strip is applied; (2) the dielectric strip is laser patterned to form via apertures and/or trace channels; (3) the via apertures and/or trace channels are filled with electrically conductive material to form vias and/or traces; (4) excess electrically conductive material is removed from the lower surface of the dielectric strip; and (5) the formed vias and/or traces are inspected and corrected, if necessary. This process is repeated any number of desired times until the desired redistribution is achieved.

Further, since the via apertures 522, 722, 922 and/or trace channels 726 are formed with a laser in one embodiment, any changes in the design layout of the via apertures 522, 722, 922 and/or trace channels 726 are relatively simple to execute. More particularly, these design layout changes are made in the computer software, e.g., the CAD software, which drives the laser. Accordingly, the design layout changes are made with some relatively simple programming and executed immediately.

Referring still to FIG. 11, although four dielectric strips 108, 708, 908, 1008 are illustrated and discussed above, more or less than four dielectric strips are used in other embodiments. Generally, at least one dielectric strip, e.g., dielectric strip 108, is used.

Further, although vias 624, 824, 924, traces 832, and lands 1044 are discussed above as being formed in various dielectric strips 108, 708, 908, and 1008 for purposes of discussion, in light of this disclosure, those of skill in the art will understand that vias, traces, lands and/or combinations thereof can be formed in any single dielectric strip 108, 708, 908, or 1008.

Further, although vias 624, 824, 924, traces 832, and lands 1044 are discussed as distinct types of structures for purposes of discussion, in light of this disclosure, those of skill in the art will understand that vias 624, 824, 924, traces 832, and lands 1044 can be similar in structure. For example, a via or trace can form a land.

Still further, via apertures 522, 722, 922, trace channels 726 and land apertures 1040 are filled immediately after formation, i.e., before application of the next dielectric strip, with an electrically conductive material to form the vias 624, 824, 924, traces 832 and lands 1044, respectively, in the discussion above. However, in an alternative embodiment, via apertures 522, 722, 922, trace channels 726 and land apertures 1040 are formed in some or all of dielectric strips 108, 708, 908, 1008. After formation, via apertures 522, 722, 922, trace channels 726 and land apertures 1040 are filled at the same time, e.g., in a single plating operation, with an electrically conductive material to form vias 624, 824, 924, traces 832 and lands 1044, respectively.

Figure 12:
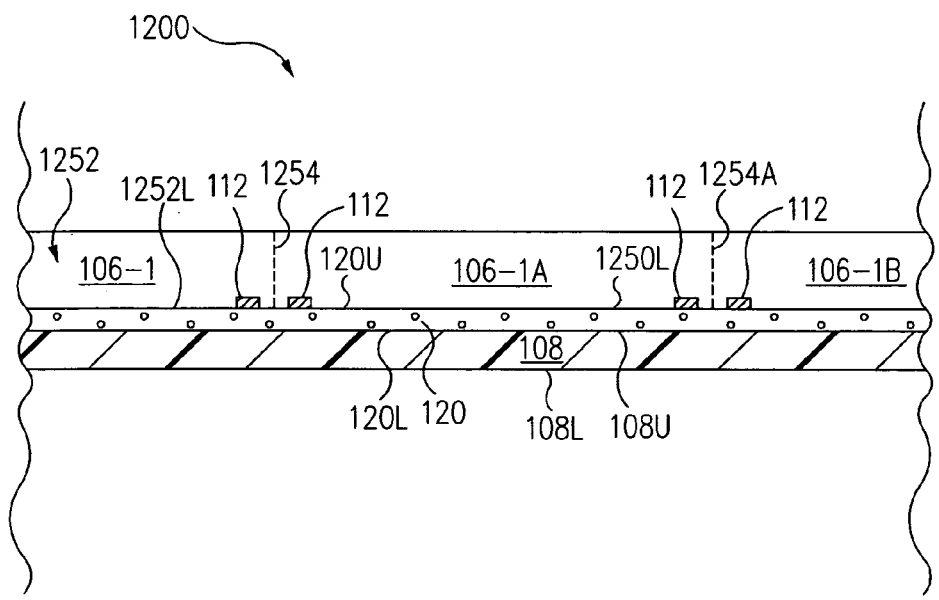
FIG. 12 is a cross-sectional view of an assembly during the fabrication of a plurality of wafer level electronic component packages in accordance with another embodiment of the present invention.

FIG. 12 is a cross-sectional view of an assembly 1200 during the fabrication of a plurality of wafer level electronic component packages in accordance with one embodiment of the present invention. Referring now to FIG. 12, assembly 1200 includes an electronic component substrate 1252 such as a silicon wafer. Electronic component substrate 1252 includes a plurality of electronic components 106-1 integrally connected together. Electronic components 106-1 include bond pads 112 on front surfaces 106F of electronic components 106-1, and more generally on a lower, e.g., first, surface 1252L of electronic component substrate 1252.

Electronic components 106-1 are integrally connected together in an array, e.g., a 2×2, 3×3 . . . or n×m array. Each of electronic components 106-1 is delineated by a singulation street 1254, which is located between adjacent electronic components 106-1. For example, a first singulation street 1254A of the plurality of singulation streets 1254 delineates a first electronic component 106-1A from a second electronic component 106-1B of the plurality of electronic components 106-1. The other electronic components 106-1 are similarly delineated from adjacent electronic components 106-1 by corresponding singulation streets 1254.

Upper surface 108U of dielectric strip 108 is mounted to front surfaces 106F of electronic components 106-1, and more generally to lower surface 1252L of electronic component substrate 1252 with adhesive strip 120. Electronic component substrate 1252 provides rigidity and support for assembly 1200.

Figure 13:
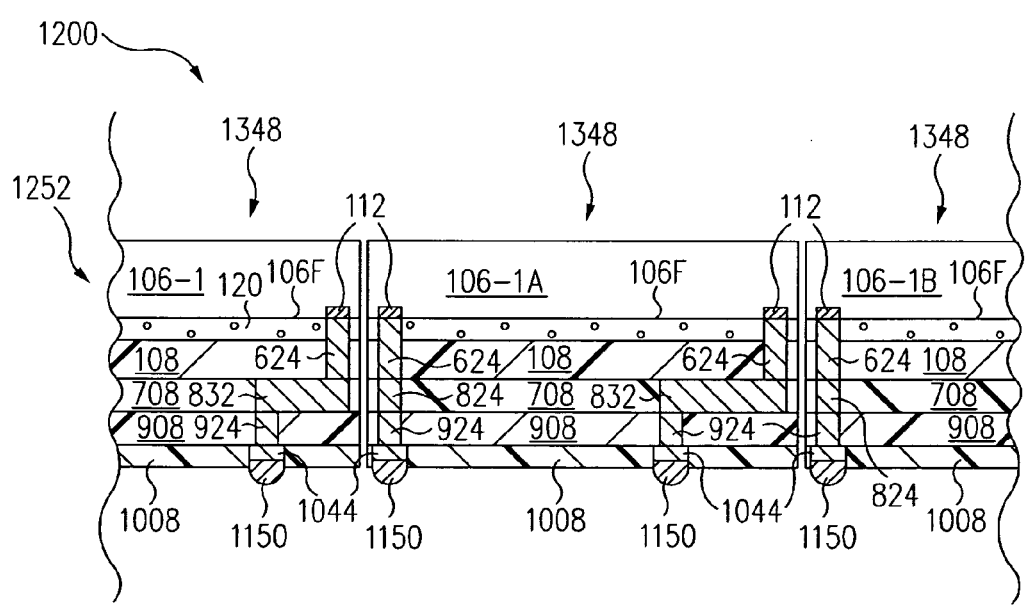
FIG. 13 is a cross-sectional view of the assembly of FIG. 12 at a further stage during the fabrication of a plurality of wafer level electronic component packages in accordance with one embodiment of the present invention.

FIG. 13 is a cross-sectional view of assembly 1200 of FIG. 12 at a further stage during the fabrication of a plurality of wafer level electronic component packages in accordance with one embodiment of the present invention. Referring now to FIG. 13, vias 624, 824, 924, traces 832, and lands 1044 are formed in dielectric strips 108, 708, 908, and 1008 as discussed above in reference to FIGS. 5–11, the discussion of which is incorporated herein by reference in its entirety.

In the embodiment illustrated in FIG. 13, interconnection balls 1150 are formed on lands 1044 to form a ball grid array (BGA) package. Each interconnection ball 1150 is coupled to a corresponding bond pad 112. However, it is to be understood that a land grid array (LGA) package can also be fabricated.

Processing of assembly 1200 is a true wafer scale process. After formation of vias 624, 824, 924, traces 832, lands 1044 in dielectric strips 108, 708, 908, 1008, assembly 1200 is singulated along singulation streets 1254 (FIG. 12) resulting in the fabrication of wafer level electronic component packages 1348. Singulation is performed before or after fabrication of interconnection balls 1150.

In one embodiment of the invention, trace channels 726 (FIGS. 7 and 8) are optimally formed in a shape suited to holding a metal layer, such as a copper metal layer, in place. In one embodiment of the invention, trace channels 726 are formed to be Gaussian in shape. In one embodiment of the invention, trace channels 726 are formed to be v-shaped. In one embodiment of the invention trace channels 726 are formed to be a generally trapezoidal shape.

In one embodiment of the invention, trace channels 726 are also formed such that the inner surface of the trace channel is textured or rough. This provides even better bonding between the metal layer and the surface of the trace channel 726. In one embodiment of the invention, the surface of the metal layer to be applied is also textured, or matted to provide even better bonding between the metal layer and the surface of the trace 726.

Figure 13A:
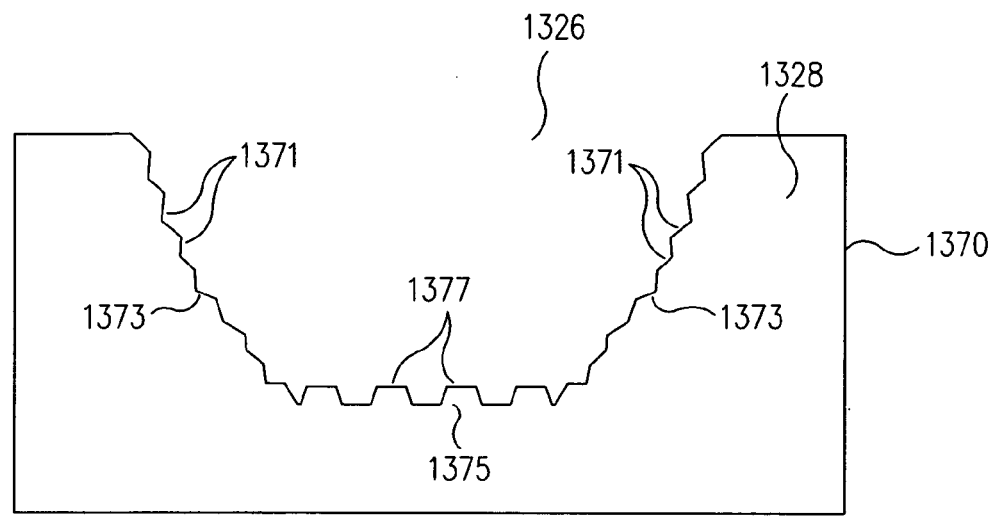
FIG. 13A shows one embodiment of a cross section of a shaped trace channel in accordance with one embodiment of the present invention.

FIG. 13A shows one embodiment of a cross section 1370 of a shaped trace channel 1326, as shaped trace channel 1326 would appear at an end 1328 of shaped trace channel 1326. Note that shaped trace channel 1326 is similar to trace 726 in FIGS. 7 and 8 and end 1328 of shaped trace channel 1326 corresponds to first end 728 of trace channels 726A and 726B in FIG. 7. As can be seen in FIG. 13A, shaped trace channel 1326 is generally trapezoidal in shape and, in one embodiment, includes roughened texture 1371 on sides 1373. In addition, in one embodiment, bottom 1375 of shaped trace channel 1326 is milled to include teeth 1377.

Figure 13B:
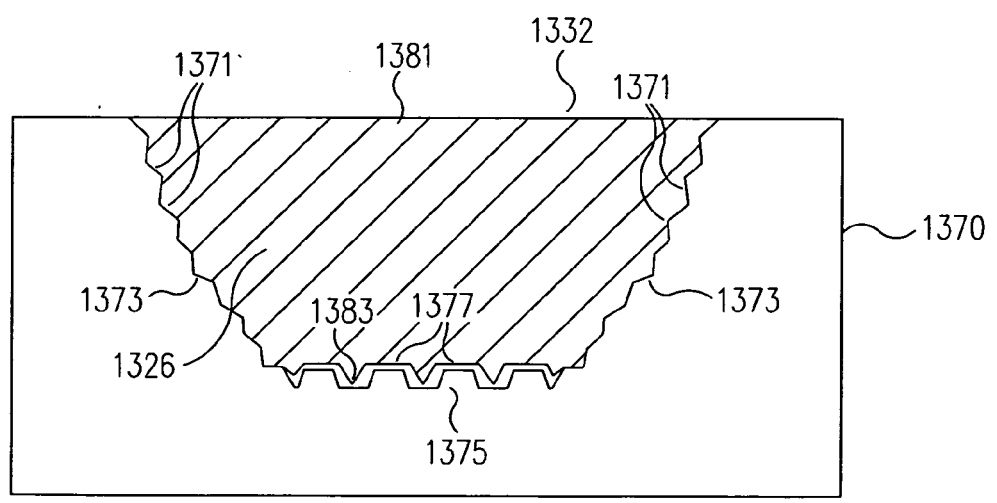
FIG. 13B shows one embodiment of a cross section of an electrically conductive trace in accordance with one embodiment of the present invention.

FIG. 13B shows one embodiment of an electrically conductive trace 1332 formed in shaped trace channel 1326 by applying a metal layer 1381, such as a copper metal layer, to shaped trace channel 1326. Note that electrically conductive trace 1332 is similar to electrically conductive trace 832 in FIG. 8. As seen in FIG. 13B, metal layer 1381 adheres readily to roughened texture 1371 on sides 1373 of shaped trace channel 1326 and teeth 1377 on bottom 1375 of shaped trace channel 1326 mesh with matted surface 1383 of metal layer 1381.

Using shaped trace channels, such as shaped trace channel 1326, according to the present invention, results in metal layer 1381 being in contact with more surface area of shaped trace channel 1326, thereby improving bonding and decreasing instances of metal separation. In addition, roughened texture 1371 on sides 1373 of shaped trace channel 1326 and teeth 1377 on bottom 1375 of shaped trace channel 1326 result in even more secure bonding between metal layer 1381 and shaped trace channel 1326.

In the one embodiment of the invention shown in FIGS. 13A and 13B, shaped trace channel 1326 is generally trapezoidal shape. However, those of skill in the art will readily recognize that shaped trace channel 1326 can be formed in a variety of shapes such as Gaussian, semicircular, semi oval, square or v-shaped.

In one embodiment of the invention, both sides of the electronic components are accessed by: forming electrically conductive traces connecting first selected bond pads of a plurality of bond pads on a first surface of an electronic component to corresponding bonding locations formed on a second surface of the electronic component; coupling the first surface of the electronic component to a first surface of a first lower dielectric strip; coupling the second surface of the electronic component to a first surface of a first upper dielectric strip; forming first lower via apertures through the first lower dielectric strip to expose second selected bond pads of the plurality of bond pads on the first surface of the electronic component; forming first upper via apertures through the first upper dielectric strip to expose the bonding locations on the second surface of the electronic component; filling the first lower via apertures with an electrically conductive material to form first lower vias electrically coupled to the second selected bond pads of the plurality of bond pads on the first surface of the electronic component; filling the first upper via apertures with an electrically conductive material to form first upper vias electrically coupled to the bonding locations on the second surface of the electronic component.

Thus, in accordance with this embodiment of the present invention, the second selected bond pads of the plurality of bond pads on the first surface of the electronic component are directly connected to the corresponding first lower vias and the first selected bond pads of the plurality of bond pads on the first surface of the electronic component are connected to the corresponding first upper vias through the electrically conductive traces and the bonding locations on the second surface of the electronic component.

Stated another way, the bond pads are electrically connected to the corresponding first lower vias and first upper vias without the use of a solder, e.g., without the use of flip chip bumps, and without the need to form a solder wetting layer, e.g., a nickel/gold layer, on the bond pads. This maximizes the reliability of the electrical connection between the first lower vias, first upper vias and the bond pads, while at the same time minimizes impedance and the size of the resulting package.

Further, since the dielectric strip is directly attached to the electronic component and the bond pads are directly connected to the corresponding first lower and upper vias, the use of an underfill material is obviated. This simplifies manufacturing, enhances reliability, and thus reduces cost.

Figure 14A:
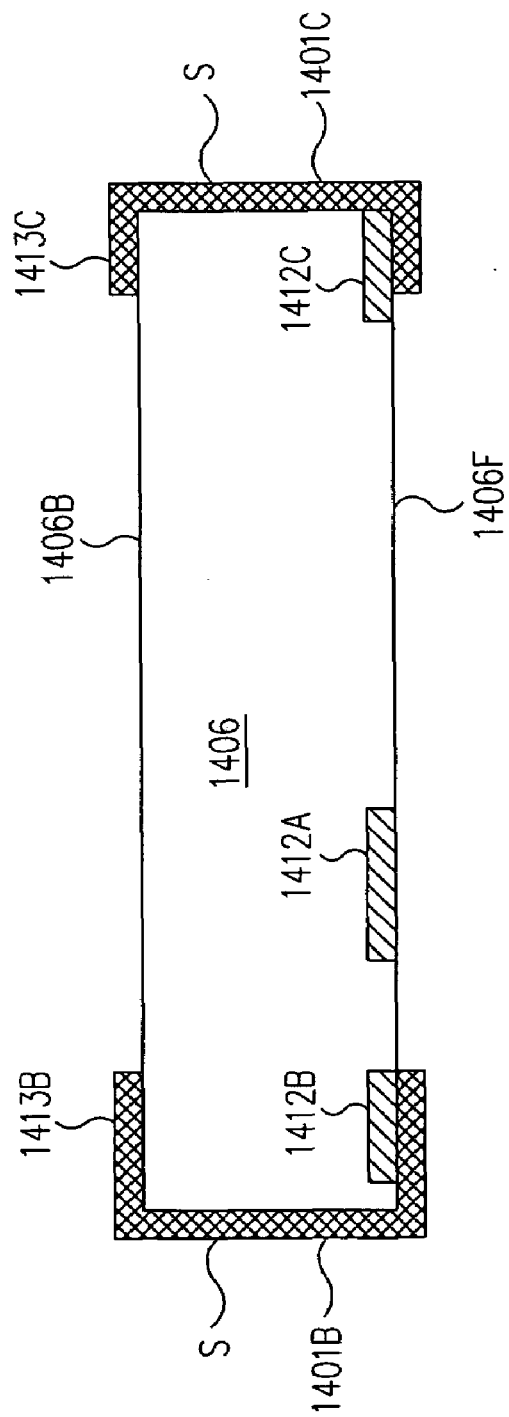
FIG. 14A is a cross-sectional side view of an electronic component modified for use with one embodiment of the present invention.

In particular, FIG. 14A is a cross-sectional side view of an electronic component modified for use with one embodiment of the present invention. As seen in FIG. 14A, formed on front, or first, surface 1406F of electronic component 1406 are bond pads 1412A, 1412B and 1412C, e.g., formed of aluminum. Bond pads 1412A, 1412B and 1412C are connected to the internal circuitry (not shown) of electronic component 1406. In one embodiment, bond pads 1412A, 1412B and 1412C are distributed in an array on front surface 1406F. In another embodiment, bond pads 1412A, 1412B and 1412C are formed on front surface 1406F directly adjacent sides S of electronic component 1406 in a typical wirebond configuration pattern.

In accordance with one embodiment of the invention, electrically conductive traces 1401B and 1401C are used to couple first selected bond pads 1412B and 1412C of bond pads 1412A, 1412B and 1412C to bonding locations 1413 formed on back, or second, surface 1406B of electronic component 1406. In one embodiment of the invention, conductive traces 1401B and 1401C are formed by methods well known to those of skill in the art and are formed of electrically conductive materials such as aluminum, copper, gold, or any other electrically conductive material. In one embodiment of the invention, bonding locations 1413B and 1413C are also formed by methods well known to those of skill in the art and are also formed of electrically conductive materials such as aluminum, copper, gold, or any other electrically conductive material.

As shown in FIG. 14A, conductive traces 1401B and 1401C are used to electrically couple first selected bond pads 1412B and 1412C on front or first surface 1406F of electronic component 1406, i.e., the first sub-set including bond pads 1412B and 1412C of the set of bond pads 1412A, 1412B and 1412C on front surface 1406F of electronic component 1406, to bonding locations 1413B and 1413C on back surface 1406B of electronic component 1406. As discussed in more detail below, this modification to electronic component 1406 allows for connections to be made to both sides, 1406F and 1406B, of electronic component 1406.

Figure 14B:
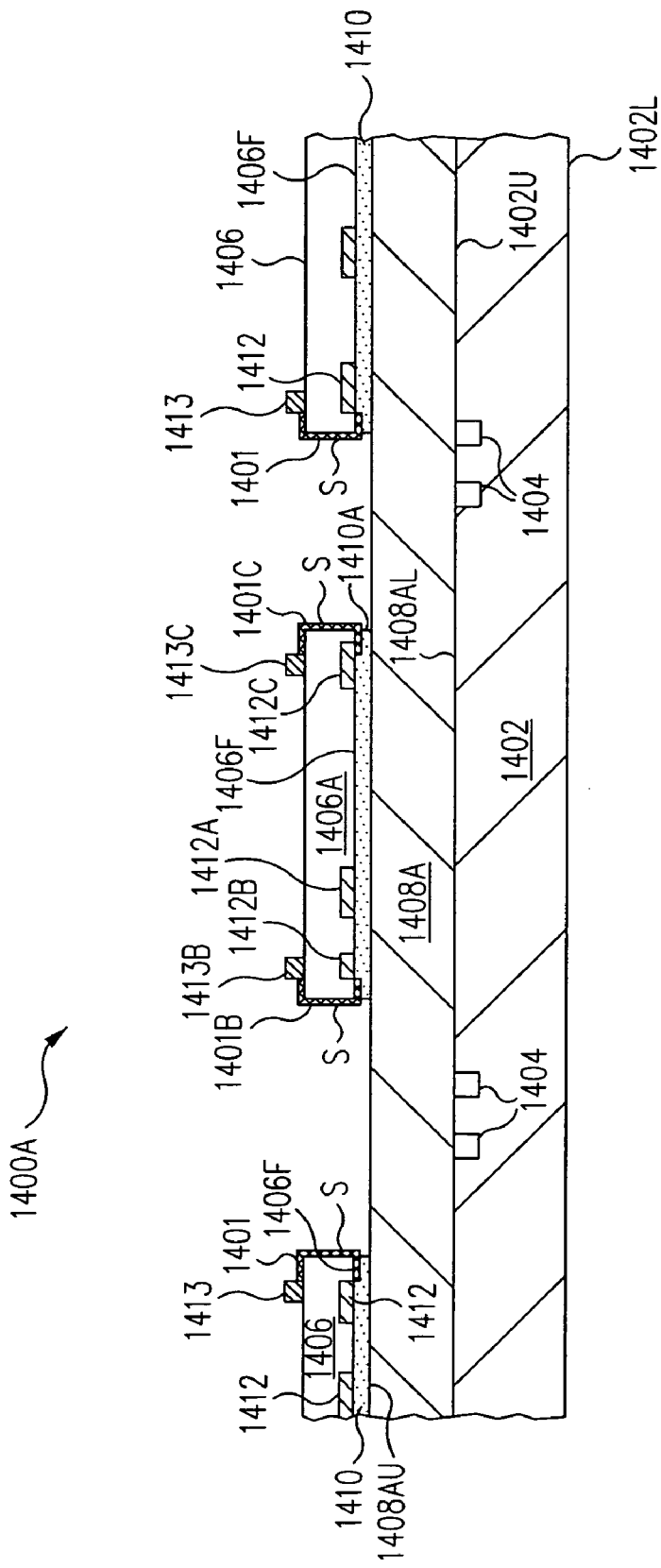
FIG. 14B is a cross-sectional view of an assembly during the fabrication of a plurality of two-sided wafer escape packages in accordance with one embodiment of the present invention.

FIG. 14B is a cross-sectional view of an assembly 1400A during the fabrication of a plurality of two-sided wafer escape packages in accordance with one embodiment of the present invention. Referring now to FIG. 14B, assembly 1400A includes a rigid support strip 1402, e.g., an aluminum, copper or stainless steel plate. Support strip 1402 includes fiducials 1404 on an upper, e.g., first, surface 1402U of support strip 1402.

Fiducials 1404 are used for alignment and mounting of electronic components 1406, e.g., integrated circuit chips, as discussed in more detail above with respect to FIGS. 1A and 1B.

A first lower dielectric strip 1408A is mounted to support strip 1402. Electronic components 1406 are mounted to first lower dielectric strip 1408A with adhesives 1410, e.g., liquid adhesives or double-sided sticky tapes, although other adhesives are used in other embodiments.

To illustrate, a first electronic component 1406A of the plurality of electronic components 1406 is mounted to first lower dielectric strip 1408A with a first adhesive 1410A of the plurality of adhesives 1410. First lower dielectric strip 1408A and adhesives 1410 are electrical insulators, i.e., dielectrics.

More particularly, front, e.g., first, surfaces 1406F of electronic components 1406 are mounted to an upper, e.g., first, surface 1408AU of first lower dielectric strip 1408A with adhesives 1410. A lower, e.g., second, surface 1408AL of first lower dielectric strip 1408A is mounted to upper surface 1402U of support strip 1402. For example, first lower dielectric strip 1408A is tacky, sometimes called sticky, and is simply pressed against support strip 1402 to mount first lower dielectric strip 1408A to support strip 1402.

In one embodiment, adhesives 1410 are applied to front surfaces 1406F of electronic components 1406 while electronic components 1406 are still in wafer form, i.e., before they are singulated.

As discussed above, in one embodiment, first lower dielectric strip 1408A is transparent such that fiducials 1404 are visible through first lower dielectric strip 1408A. Electronic components 1406 are aligned to fiducials 1404 and mounted to first lower dielectric strip 1408A with adhesives 1410, e.g., using an optical alignment system. Adhesives 1410 are cured, if necessary.

In one embodiment, electronic components 1406 are mounted in a single row on first lower dielectric strip 1408A. However, in other embodiments, electronic components 1406 are mounted in an array on first lower dielectric strip 1408A. Illustratively, electronic components 1406 are mounted in a 2×2, 3×3, . . . , or n×m array. In yet another embodiment, only a single electronic component 1406 is mounted to first lower dielectric strip 1408A, i.e., the wafer level electronic component package is fabricated as an individual unit instead of as one of a plurality of units fabricated simultaneously.

Figure 14C:
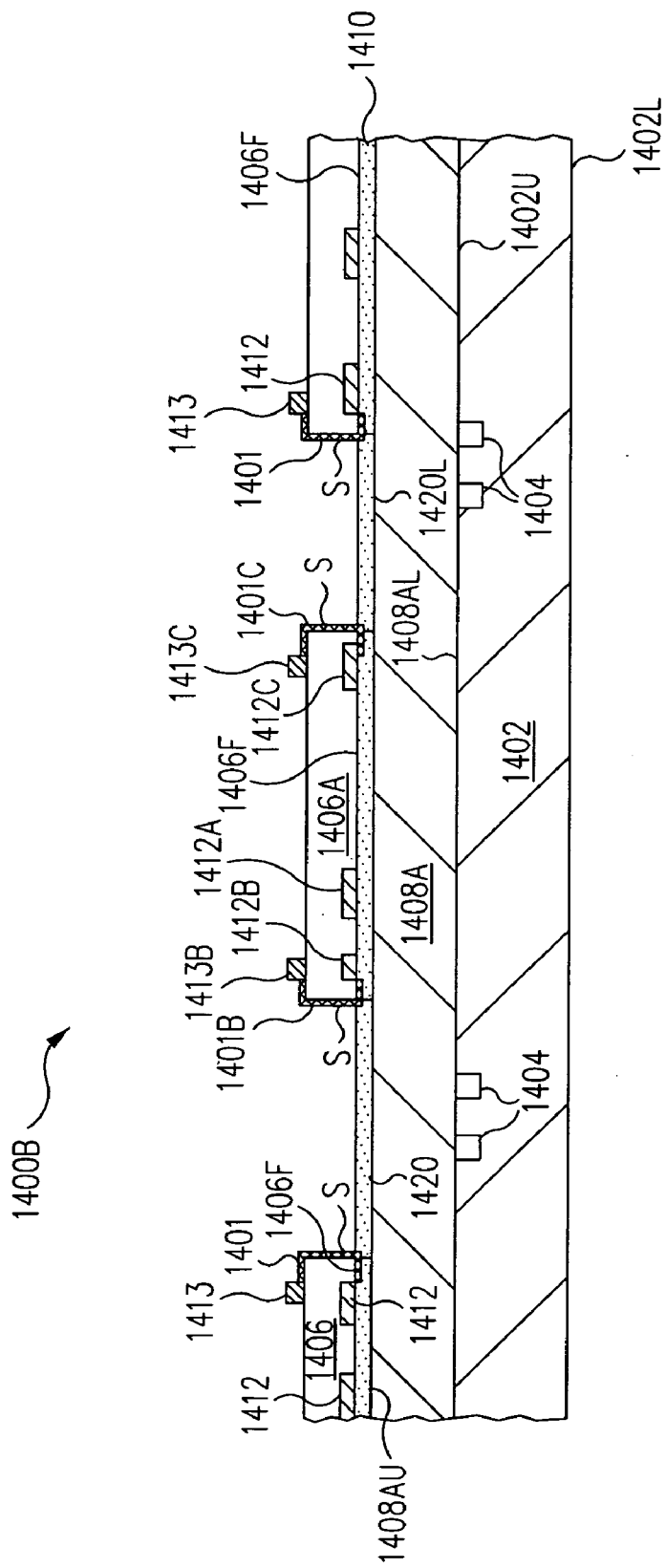
FIG. 14C is a cross-sectional view of an assembly during the fabrication of a plurality of two-sided wafer escape packages in accordance with one embodiment of the present invention.

FIG. 14C is a cross-sectional view of an assembly 1400B during the fabrication of a plurality of two-sided wafer escape packages in accordance with another embodiment of the present invention. Assembly 1400B of FIG. 14C is similar to assembly 1400A of FIG. 14B and only the significant differences are discussed below.

Referring now to FIGS. 14B and 14C together, instead of mounting electronic components 1406 to first lower dielectric strip 1408A using individual adhesives 1410 as illustrated in FIG. 14B, an adhesive strip 1420 (FIG. 14C) is used to mount electronic components 1406.

Adhesive strip 1420 is an electrical insulator. Illustratively, adhesive strip 1420 is a liquid adhesive, for example, applied by spin coating. As another example, adhesive strip 1420 is a double-sided sticky tape although other adhesives are used in other embodiments.

More particularly, a lower, e.g., first, surface 1420L of adhesive strip 1420 is mounted to upper surface 1408AU of first lower dielectric strip 1408A. Front surfaces 1406F of electronic components 1406 are mounted to an upper, e.g., second, surface 1420U of adhesive strip 1420. Although use of adhesive strip 1420 is illustrated in the figures which follow and discussed below for purposes of simplicity, it is to be understood that adhesives 1410 (FIG. 14B) are used instead of adhesive strip 1420 in an alternative embodiment.

Figure 15:
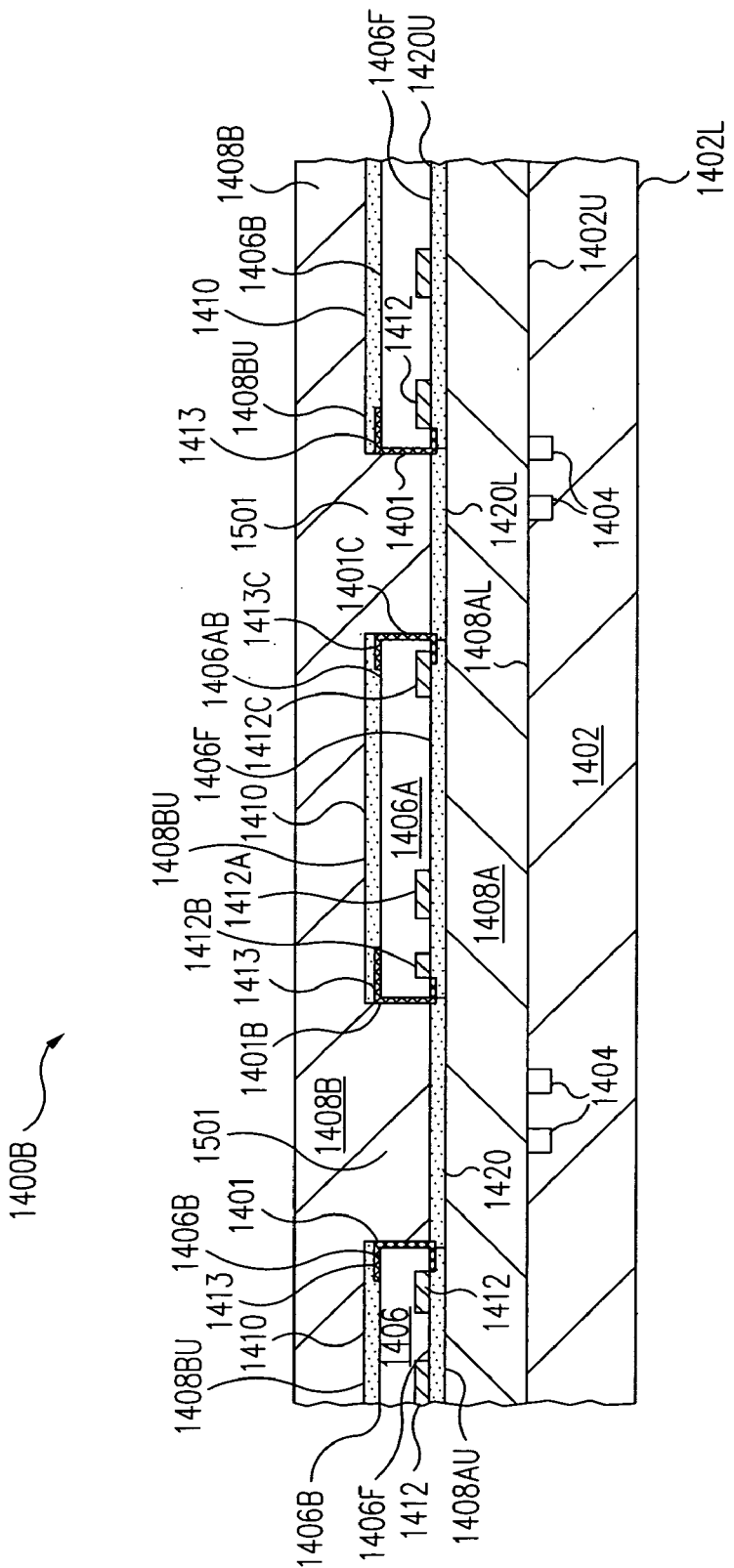
FIGS. 15, 16, 17, 18A, 18B, 19, 20, 21, 21A, 21B, 22, 23, 24, 25, 26, and 27 are cross-sectional views of the assembly of FIG. 14C at further stages during the fabrication of a plurality of two-sided wafer escape packages in accordance with various embodiments of the present invention.

FIG. 15 is a cross-sectional view of assembly 1400B of FIG. 14C at a further stage during the fabrication of a two-sided wafer escape package in accordance with one embodiment of the present invention. As shown in FIG. 15 a first upper dielectric strip 1408B is mounted to back or second surfaces 1406B of electronic components 1406 with adhesives 1410, e.g., liquid adhesives or double-sided sticky tapes, although other adhesives are used in other embodiments.

More particularly, back, e.g., second, surfaces 1406B of electronic components 1406 and 1406A are mounted to an upper, e.g., first, surface 1408BU of first upper dielectric strip 1408B with adhesives 1410.

In one embodiment of the invention portions between electronic components 1406 is filled in by simply pressing first upper dielectric strip 1408B into adhesive layer 1420. For example, in one embodiment of the invention, first upper dielectric strip 1408B is tacky, sometimes called sticky, and is simply pressed against adhesive layer 1420 to form fill portions 1501 between electronic components 1406. In another embodiment of the invention, portions 1501 between electronic components are filled by a separate dielectric layer(s) (not shown) applied before first upper dielectric strip 1408B in a laminate fashion. In yet another embodiment of the invention, first upper dielectric strip 1408B is custom made to include thicker portions designed to fill portions 1501 between electronic components 1406. In yet another embodiment of the invention, first upper dielectric strip 1408B is applied as a liquid and portions 1501 between electronic components are filled with first upper dielectric strip 1408B while it is in a liquid state. In this embodiment, first upper dielectric strip 1408B is then cured.

In one embodiment, adhesives 1410 are applied to back surfaces 1406B and 1406AB of electronic components 1406 and 1406A, respectively, while electronic components 1406 are still in wafer form, i.e., before they are singulated.

Figure 16:
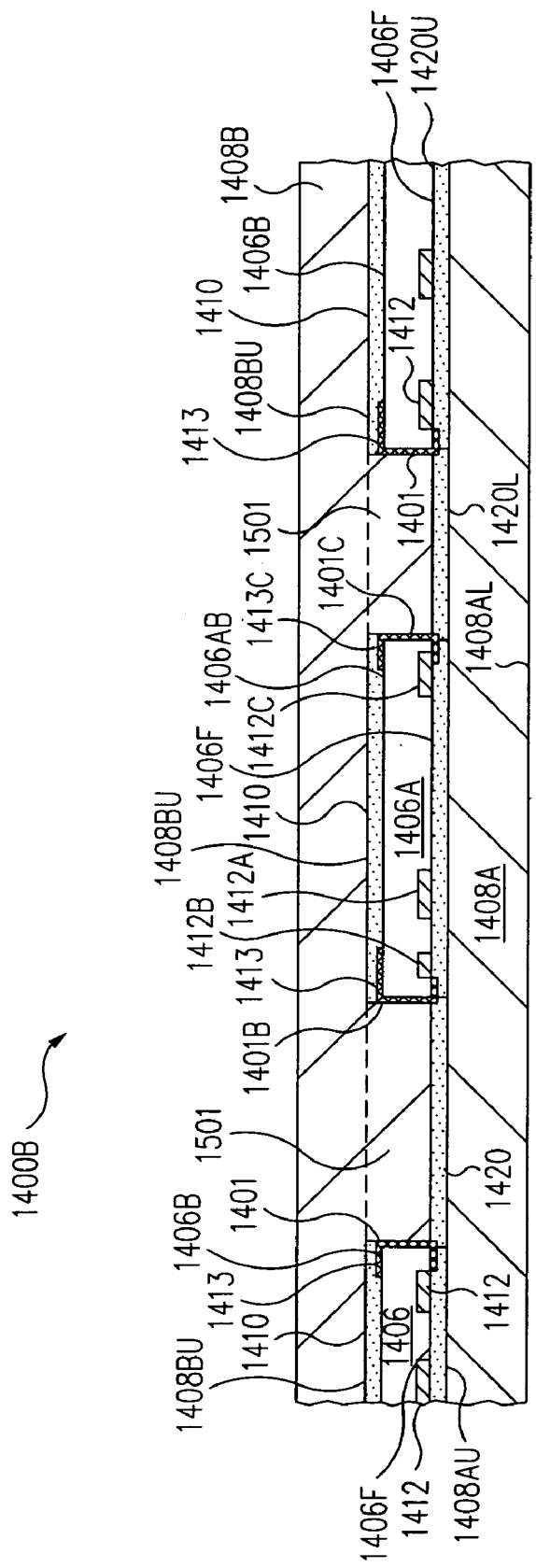

FIG. 16 is a cross-sectional view of assembly 1400B of FIG. 15 at a further stage during the fabrication of a plurality of two-sided wafer escape packages in accordance with one embodiment of the present invention. Referring now to FIGS. 15 and 16 together, support strip 1402 is removed from first lower dielectric strip 1408A. In one embodiment, upper surface 1402U of support strip 1402 is pretreated, e.g., a release agent is applied, to facilitate easy removal of support strip 1402. In one embodiment, support strip 1402 is reusable and thus reused to fabricate another assembly 1400B as illustrated in FIG. 14C after removal from lower dielectric strip 1408A thus minimizing the cost of fabricating assembly 1400B.

Figure 17:
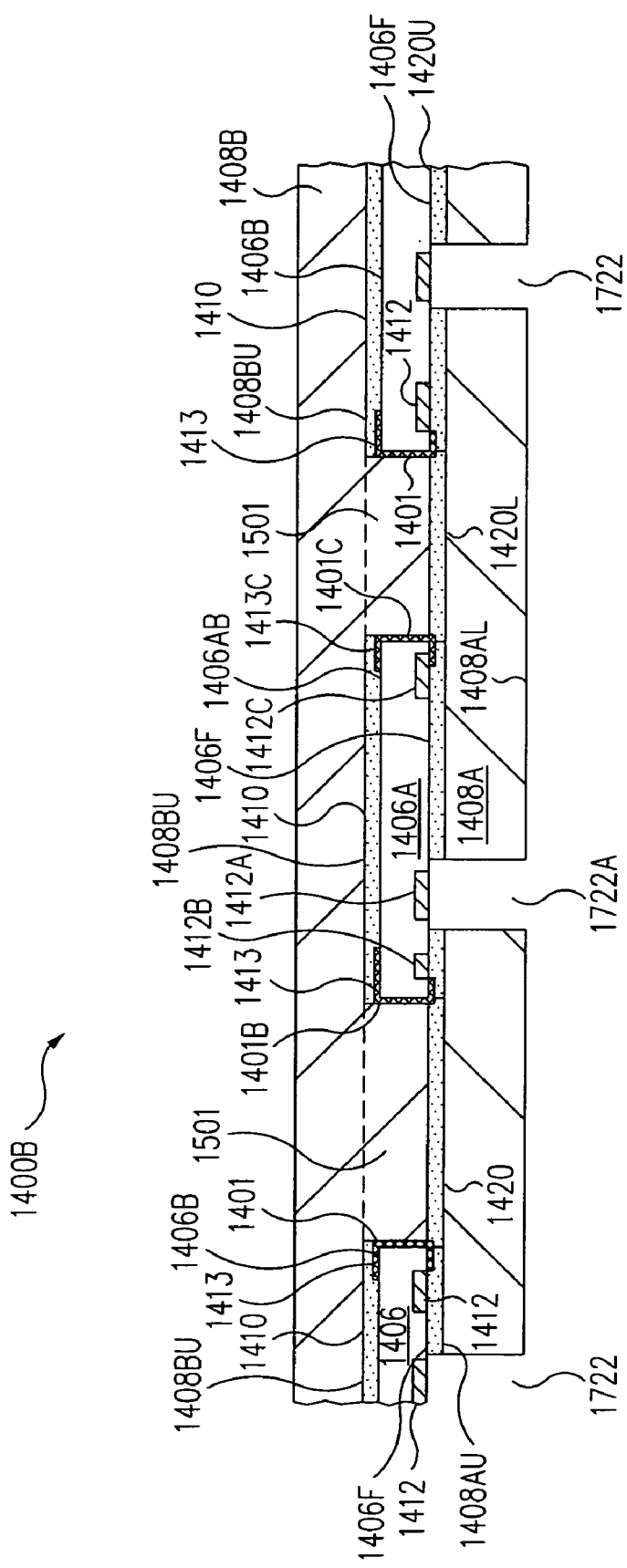

FIG. 17 is a cross-sectional view of assembly 1400B of FIG. 16 at a further stage during the fabrication of a plurality of two-sided wafer escape packages in accordance with one embodiment of the present invention. Referring now to FIG. 17, a plurality of lower via apertures 1722 are formed. using a laser, i.e., using laser ablation. Lower via apertures 1722 are sometimes called first lower via apertures.

First lower via apertures 1722 extend through first lower dielectric strip 1408A and through adhesive strip 1420 to bond pads 1412 of electronic components 1406. In one embodiment, first lower via apertures 1722 are cylindrical in shape. Bond pads 1412 are exposed through first lower via apertures 1722.

In one embodiment, the laser intensity is set to be sufficient to remove first lower dielectric strip 1408A and adhesive strip 1420. However, the laser intensity is set to be insufficient to remove bond pads 1412. Accordingly, pulsing of the laser forms a single first lower via aperture 1722 extending through first lower dielectric strip 1408A and through adhesive strip 1420 to a bond pad 1412 of electronic components 1406. The laser is then stepped to the next location to form the next first lower via aperture 1722.

To illustrate, electronic component 1406A includes bond pads 1412A, 1412B, and 1412C on front surface 1406F of electronic component 1406A. First lower via aperture 1722A of the plurality of first lower via apertures 1722 extends through first lower dielectric strip 1408A and through adhesive strip 1420 to bond pad 1412A.

To further illustrate, initially, the laser is pulsed to form first lower via aperture 1722A. The laser is then stepped and pulsed repeatedly until all of lower via apertures 1722 are formed. However, in another embodiment, a plurality of lasers are simultaneous pulsed to form some or all of first lower via apertures 1722 simultaneously. In yet other embodiments, first lower via apertures 1722 are formed using selective etching, mechanical drilling, or other techniques.

Figure 18A:
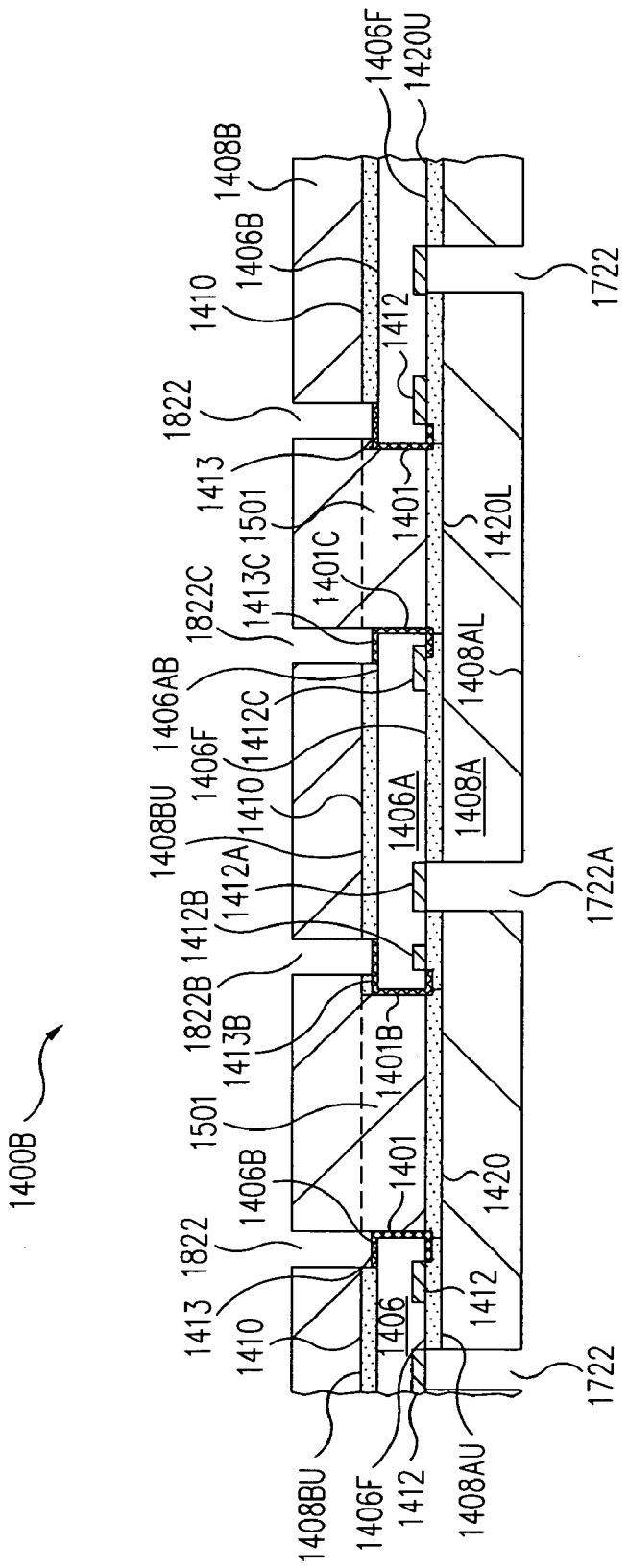

FIG. 18A is a cross-sectional view of assembly 1400B of FIG. 17 at a further stage during the fabrication of a plurality of two-sided wafer escape packages in accordance with one embodiment of the present invention. Referring now to FIG. 18, a plurality of via apertures 1822 are formed using a laser, i.e., using laser ablation. Via apertures 1822 are sometimes called first upper via apertures.

First upper via apertures 1822 extend through first upper dielectric strip 1408B and through adhesive strips 1410 to bonding locations 1413 of electronic components 1406. In one embodiment, first upper via apertures 1822 are cylindrical in shape. Bonding locations 1413 are exposed through first upper via apertures 1822.

As with first lower via apertures 1722 discussed above, in one embodiment, the laser intensity is set to be sufficient to remove first upper dielectric strip 1408B and adhesive strips 1410. However, the laser intensity is set to be insufficient to remove bonding locations 1413. Accordingly, pulsing of the laser forms a single first upper via aperture 1822 extending through dielectric strip 1408B and through adhesive strip 1410 to a bonding location 1413 of electronic components 1406. The laser is then stepped to the next location to form the next first upper via aperture 1822.

To illustrate, electronic component 1406A includes bonding locations 1413B and 1413C on back, or second, surface 1406AB of electronic component 1406A. First upper via apertures 1822B and 1822C of the plurality of first upper via apertures 1822 extend through first upper dielectric strip 1408B and through adhesive strip 1410 to bonding locations 1413B and 1413C, respectively.

To further illustrate, initially, the laser is pulsed to form first upper via aperture 1822B. Then the laser is pulsed to form first upper via aperture 1822C. The laser is then stepped and pulsed repeatedly until all of first upper via apertures 1822 are formed. However, in another embodiment, a plurality of lasers are simultaneous pulsed to form some or all of first upper via apertures 1822 simultaneously. In yet other embodiments, first upper via apertures 1822 are formed using selective etching, mechanical drilling, or other techniques.

Those of skill in the art will readily recognize that while the formation of first lower and first upper via apertures 1722 and 1822 is shown as two steps for clarity of the discussion above. In other embodiments of the invention, first lower and first upper via apertures 1722 and 1822 are formed in a single step by employing lasers on both sides 1400U and 1400L of assembly 1400B.

Figure 18B:
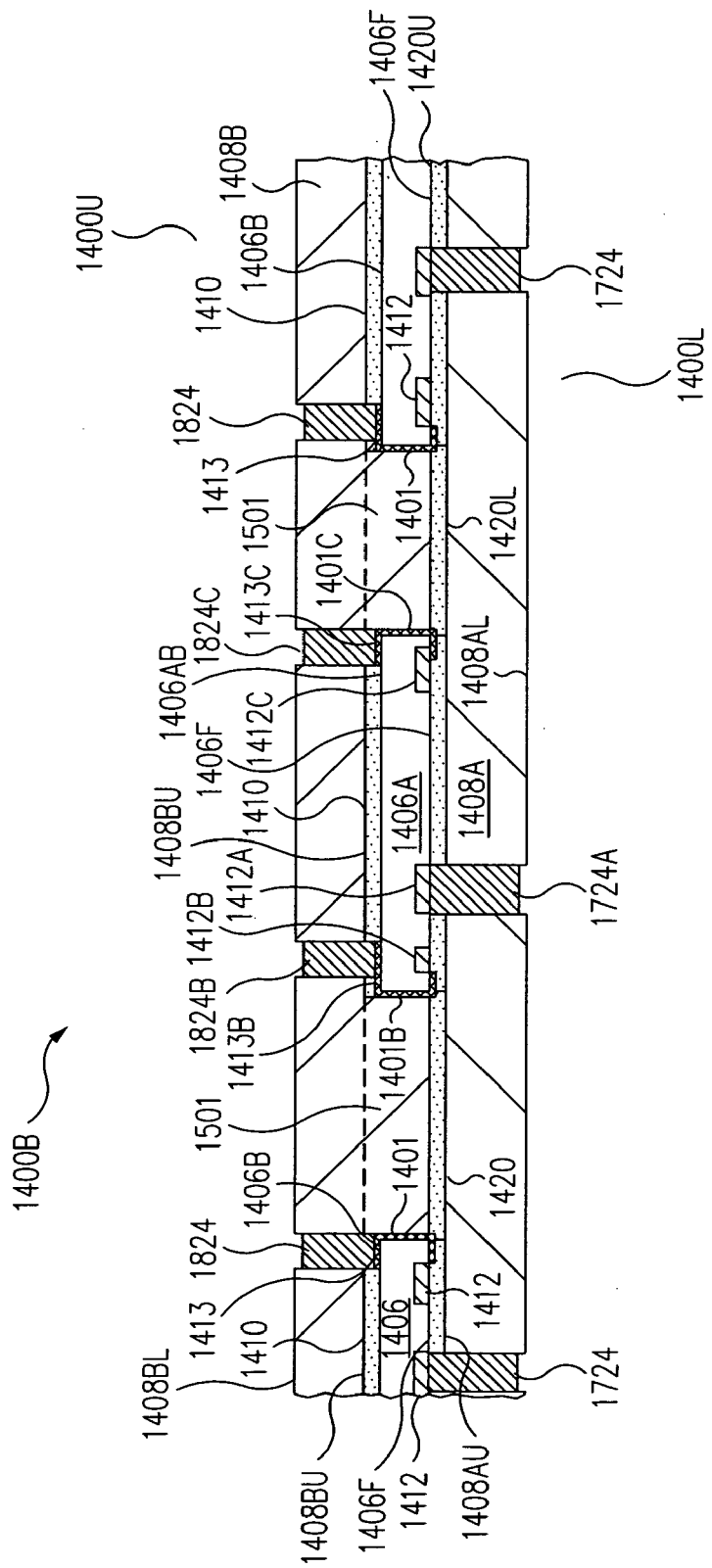

FIG. 18B is a cross-sectional view of assembly 1400B of FIG. 18A at a further stage during the fabrication of a plurality of two-sided wafer escape packages in accordance with one embodiment of the present invention. Referring now to FIGS. 18A and 18B together, first lower and first upper via apertures 1722 and 1822 are filled with an electrically conductive material, e.g., a metal or metal containing material, an electrically conductive adhesive such as a silver filled adhesive or polymer, or solder paste, to form first lower electrically conductive vias 1724 and first upper electrically conductive vias 1824.

In one embodiment, copper or a copper containing material is plated in first lower via apertures 1722 and first upper via apertures 1822 to form first lower and first upper vias 1724 and 1824, respectively. In another embodiment, first lower via apertures 1722 and first upper via apertures 1822 are filled with an electrically conductive adhesive, which is then cured if necessary, to form first lower and first upper vias 1724 and 1824, respectively. In yet another embodiment, first lower via apertures 1722 and first upper via apertures 1822 are filled with a solder paste. Assembly 1400B is then heated to reflow the solder paste to form first lower and first upper vias 1724 and 1824.

After formation of first lower and first upper vias 1724 and 1824, any excess electrically conductive material formed on lower surface 1408AL of first lower dielectric strip 1408A and lower surface 1408BL of first upper dielectric strip 1408B is removed. Illustratively, an etch or physical grinding process is used.

In one embodiment, an over-etch process is used to slightly over-etch first lower vias 1724 and first upper vias 1824. Thus, first lower vias 1724 and first upper vias 1824 remain recessed within first lower via apertures 1722 and first upper via apertures 1822, respectively. This ensures that shorting between vias from excess electrically conductive material is avoided.

First lower vias 1724 are electrically connected to selected corresponding bond pads 1412. First upper vias 1824 are electrically connected to bonding locations 1413 and to selected corresponding bond pads 1412 through traces 1401.

To illustrate, first lower via 1724A of the plurality of first lower vias 1724 is electrically connected to bond pad 1412A. First lower via 1724A extends from bond pad 1412A, through adhesive strip 1420 and through lower dielectric strip 1408A to be adjacent or slightly recessed from (above in the view of FIG. 18B) lower surface 1408AL of first lower dielectric strip 1408A. In addition, first upper vias 1824B and 1824C are electrically connected to bonding locations 1413B and 1413C, respectively, and first upper vias 1824B and 1824C extend through first upper dielectric strip 1408B to be adjacent or slightly recessed from (below in the view of FIG. 18B) lower surface 1408BL of first upper dielectric strip 1408B.

Likewise, all second selected bond pads 1412 are directly connected to corresponding first lower vias 1724. In addition, all bonding locations 1413 are directly connected to corresponding first upper vias 1824, first upper vias 1824 are directly connected to conductive traces 1401 and conductive traces 1401 are directly connected first selected bond pads 1412. Stated another way, bond pads 1412 are electrically connected to corresponding first lower vias 1724 or first upper vias 1824 without the use of a solder, e.g., without the use of flip chip bumps, and without the need to form a solder wetting layer, e.g., a nickel/gold layer, on bond pads 1412. This maximizes the reliability of the electrical connection between first lower and first upper vias 1724 and 1824 and bond pads 1412, while at the same time minimizes impedance.

Further, since first lower and first upper dielectric strips 1408A and 1408B are directly attached to electronic components 1406 by adhesive strips 1420 and 1410, and bond pads 1412 are connected to corresponding first lower and first upper vias 1724 and 1824, the use of an underfill material is obviated. This simplifies manufacturing, enhances reliability, and thus reduces cost.

After formation of first lower and first upper vias 1724 and 1824, assembly 1400B is inspected, e.g., optically using an automatic inspection system, to insure that first lower and first upper via apertures 1722 and 1822 are properly filled with electrically conductive material, i.e., to inspect the integrity of first lower and first upper vias 1724 and 1824. In one embodiment, any defective or unformed first lower and first upper vias 1724, 1824 detected during the inspection are corrected, e.g., by etch removal of first lower and first upper vias 1724 and 1824, reapplication of the electrically conductive material to reform first lower and first upper vias 1724 and 1824, e.g., re-plating, and removal of any excess electrically conductive material on lower surface 1408AL and 1408BL of first lower and first upper dielectric strips 1408A and 1408B.

In this manner, the two-sided wafer escape packages are fabricated with a maximum yield, e.g., essentially a 100 percent yield. This further minimizes the fabrication cost of the two-sided wafer escape packages.

Figure 19:
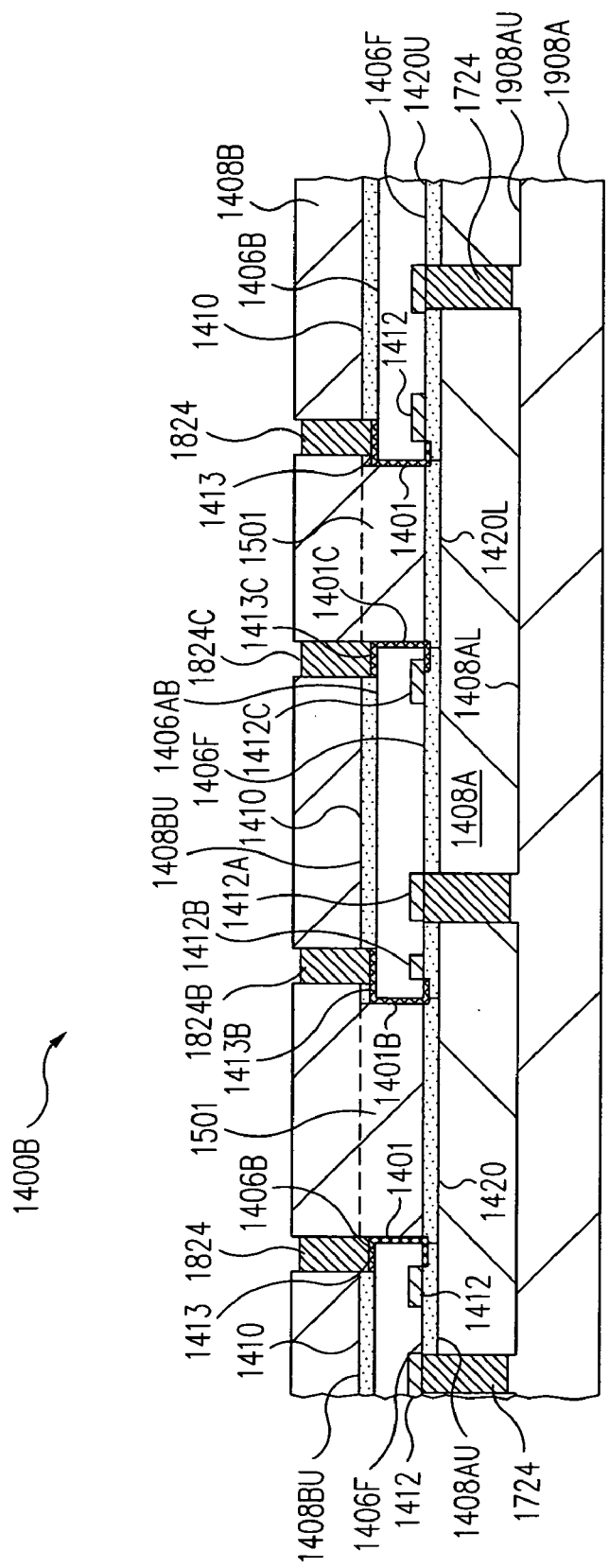

FIG. 19 is a cross-sectional view of assembly 1400B of FIG. 18B at a further stage during the fabrication of a plurality of two-sided wafer escape packages in accordance with one embodiment of the present invention. Referring now to FIG. 19, a second lower dielectric strip 1908A is mounted to first lower dielectric strip 1408A. More particularly, an upper, e.g., first, surface 1908AU of second lower dielectric strip 1908A is mounted to lower surface 1408AL of first lower dielectric strip 1408A.

For example, in one embodiment, second lower dielectric strip 1908A is mounted to first lower dielectric strip 1408A using a tack cure. More particularly, second lower dielectric strip 1908A is pressed on to first lower dielectric strip 1408A. Assembly 1400B is heated to fuse together and bond second lower dielectric strip 1908A to first lower dielectric strip 1408A.

Illustratively, first lower dielectric strip 1408A and second lower dielectric strip 1908A are polytetrafluoroethylene (PTFE), liquid crystal polymer (LCP) or a non woven arimid although other low-K dielectric materials are used in other embodiments.

Figure 20:
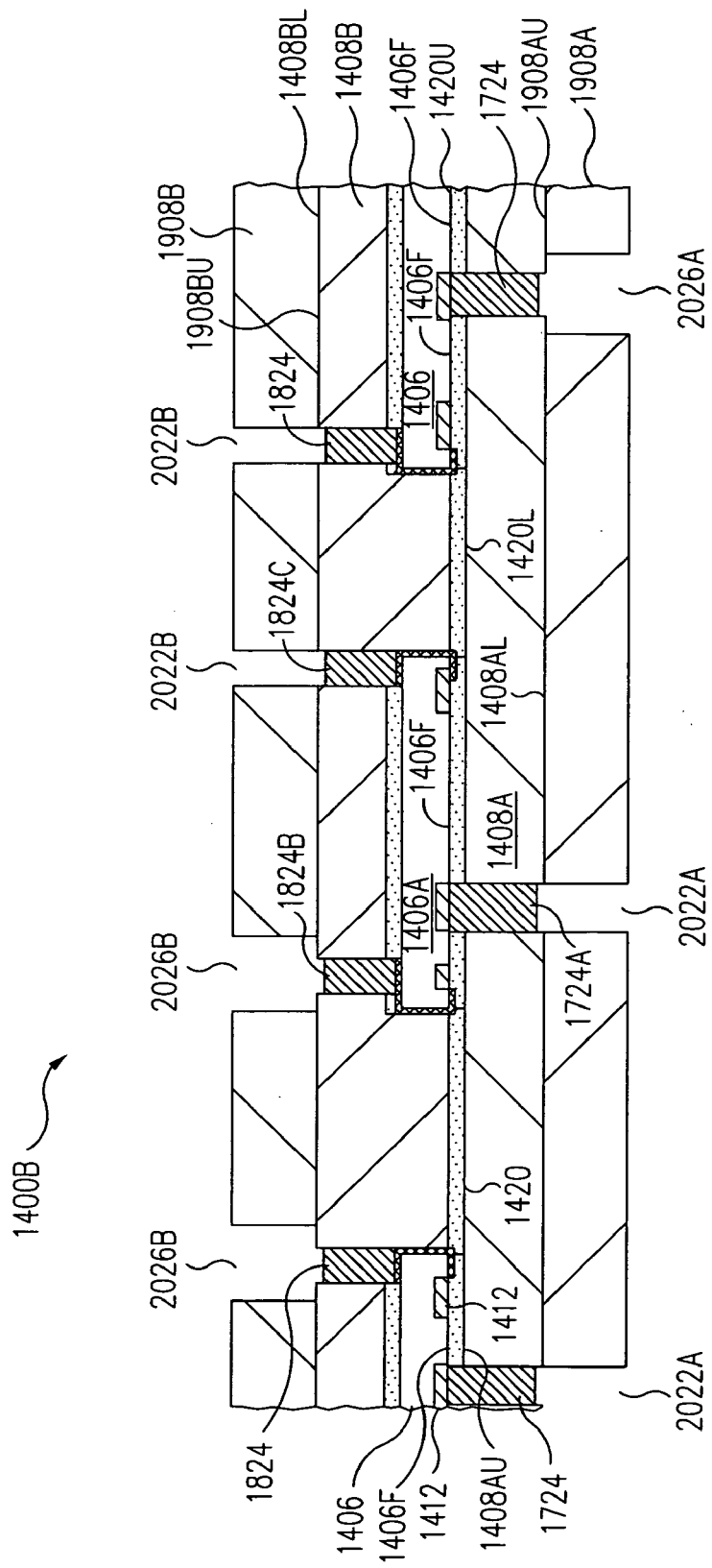

FIG. 20 is a cross-sectional view of assembly 1400B of FIG. 19 at a further stage during the fabrication of a plurality of two-sided wafer escape packages in accordance with one embodiment of the present invention. Referring now to FIG. 20, a second upper dielectric strip 1908B is mounted to first upper dielectric strip 1408B. More particularly, an upper, e.g., first, surface 1908BU of second upper dielectric strip 1908B is mounted to lower surface 1408BL of first upper dielectric strip 1408B.

For example, in one embodiment, second upper dielectric strip 1908B is mounted to first upper dielectric strip 1408B using a tack cure. More particularly, second upper dielectric strip 1908B is pressed on to first upper dielectric strip 1408B. As discussed above, in one embodiment, assembly 1400B is heated to fuse together and bond second upper dielectric strip 1908B to first upper dielectric strip 1408B.

Illustratively, in one embodiment, first upper dielectric strip 1408B and second upper dielectric strip 1908B are polytetrafluoroethylene (PTFE), liquid crystal polymer (LCP) or a non woven arimid although other low-K dielectric materials are used in other embodiments.

A plurality of via apertures 2022A, 2022B and trace channels 2026A, 2026B are formed using a laser, i.e., using laser ablation. Via apertures 2022A and trace channels 2026A extend through second lower dielectric strip 1908A and connect to first lower vias 1724. Via apertures 2022A are sometimes called second lower via apertures. Similarly, via apertures 2022B and trace channels 2026B extend through second upper dielectric strip 1908B and connect to first upper vias 1824. Via apertures 2022B are sometimes called second upper via apertures.

In one embodiment, second lower via apertures 2022A are cylindrical in shape and extend vertically, i.e., in a first direction perpendicular to front surface 1406F of electronic components 1406, through second lower dielectric strip 1908A to first lower vias 1724 and second upper via apertures 2022B are cylindrical in shape and extend vertically, i.e., in a first direction perpendicular to front surface 1406F of electronic components 1406, through second upper dielectric strip 1908B to first upper vias 1824.

Trace channels 2026A are trenches extending horizontally, i.e., in a second direction perpendicular to the first direction and parallel to front surface 1406F of electronic components 1406, from first upper vias 1724. Trace channels 2026A are sometimes called first lower trace channels. Trace channels 2026B are trenches extending horizontally, i.e., in a second direction perpendicular to the first direction and parallel to front surface 1406F of electronic components 1406, from first upper vias 1824. Trace channels 2026B are sometimes called first upper trace channels.

First lower vias 1724 are exposed through second lower via apertures 2022A and first lower trace channels 2026A. First upper vias 1824 are exposed through second upper via apertures 2022B and first upper trace channels 2026B. The physical relationships and/or connections and configuration of first lower vias 1724, second lower via apertures 2022A and first lower trace channels 2026A is similar to the physical relationship between vias 624, via apertures 722 and trace channels 726 discussed above. Likewise, the physical relationships and/or connections and configuration of first upper vias 1824, second upper via apertures 2022B and first upper trace channels 2026B is similar to the physical relationship between vias 624, via apertures 722 and trace channels 726 discussed above. Consequently, the reader is referred to the discussion above regarding FIG. 7 for a more detailed description of theses relationships.

In one embodiment, a laser is stepped and pulsed repeatedly to form second lower via apertures 2022A, second upper via apertures 2022B and first lower and upper trace channels 2026A, 2026B. However, in another embodiment, a plurality of lasers are simultaneous pulsed to form some or all of second lower and upper via apertures 2022A, 2022B and first lower and upper trace channels 2026A, 2026B simultaneously. During formation of first lower and upper trace channels 2026A and 2026B, the laser is moved during pulsing to form the horizontal trenches of first lower and upper trace channels 2026A, 2026B.

By controlling the laser intensity and pulse time, second lower and upper via apertures 2022A, 2022B and first lower and upper trace channels 2026A, 2026B are all formed to have the same depth, this depth being equal to the thickness of second lower and upper dielectric strips 1908A and 1908B. This simplifies and enhances reliability of filling, e.g., plating, of second lower and upper via apertures 2022A, 2022B and first lower and upper trace channels 2026A, 2026B with an electrically conductive material as discussed below.

Figure 21:
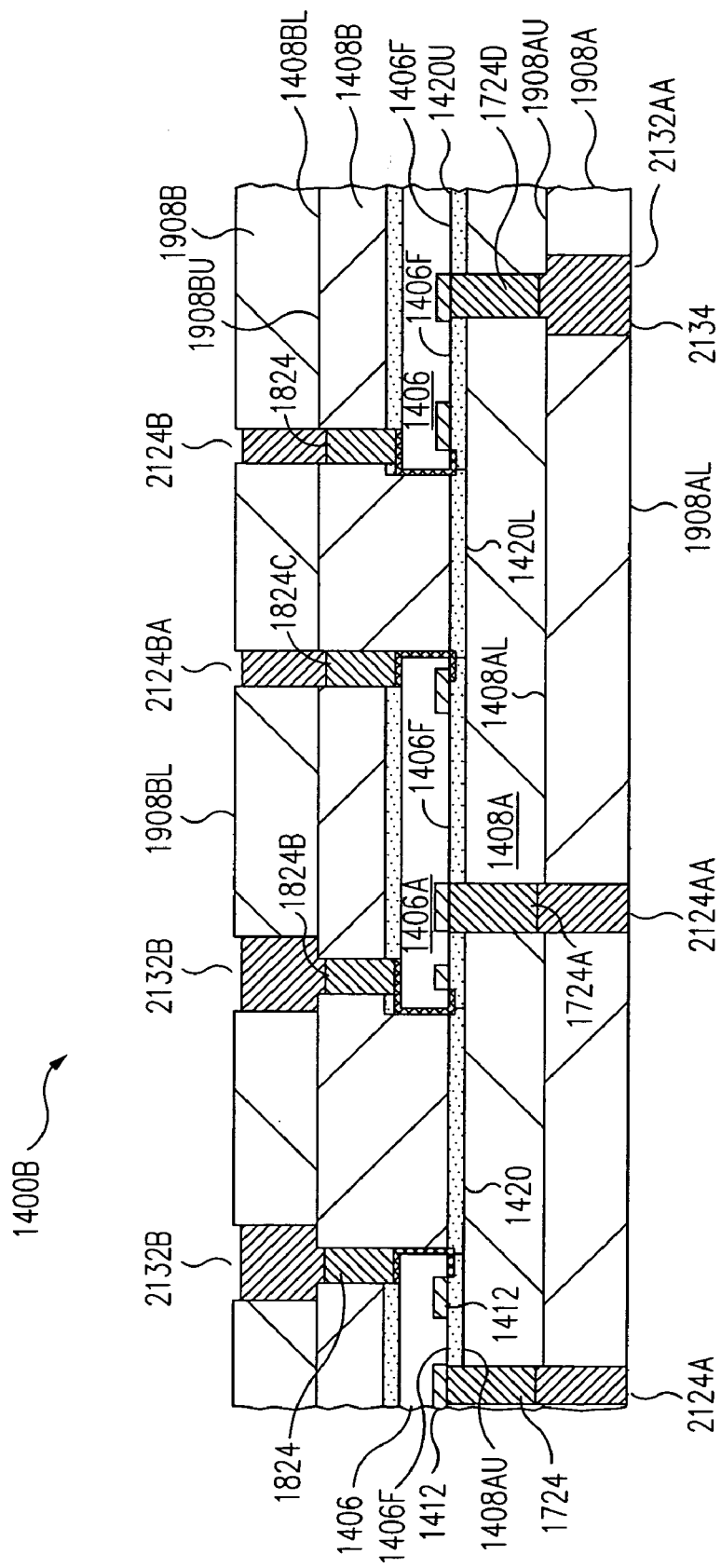

FIG. 21 is a cross-sectional view of assembly 1400B of FIG. 20 at a further stage during the fabrication of a plurality of two-sided wafer escape packages in accordance with one embodiment of the present invention. Referring now to FIGS. 20 and 21 together, second lower and upper via apertures 2022A, 2022B and first lower and upper trace channels 2026A, 2026B are filled with an electrically conductive material, e.g., a metal or metal containing material, an electrically conductive adhesive, or solder paste, to form electrically conductive vias 2124A, 2124B and electrically conductive traces 2132A, 2132B respectively. Vias 2124A are sometimes called second lower vias. Vias 2124B are sometimes called second upper vias.

In one embodiment, copper or a copper containing material is plated in second lower and upper via apertures 2022A, 2022B and first lower and upper trace channels 2026A, 2026B to form second lower and upper vias 2124A, 2124B and first lower and upper traces 2132A, 2132B respectively. In another embodiment, second lower and upper via apertures 2022A, 2022B and first lower and upper trace channels 2026A, 2026B are filled with an electrically conductive adhesive, which is then cured if necessary, to form second lower and upper vias 2124A, 2124B and first lower and upper traces 2132A, 2132B respectively. In yet another embodiment, second lower and upper via apertures 2022A, 2022B and first lower and upper trace channels 2026A, 2026B are filled with a solder paste. Assembly 1400B is then heated to reflow the solder paste to form second lower and upper vias 2124A, 2124B and first lower and upper traces 2132A, 2132B respectively.

Second lower and upper vias 2124A, 2124B form vertical electrical connectors, i.e., form electrical connectors extending vertically. First lower and upper traces 2132A, 2132B form horizontal electrical connectors, i.e., form electrical connectors extending horizontally.

After formation of second lower vias 2124A and first lower traces 2132A, any excess electrically conductive material formed on a lower, e.g., second, surface 1908AL of second lower dielectric strip 1908A is removed. Likewise, after formation of second upper vias 2124B and first upper traces 2132B, any excess electrically conductive material formed on a lower, e.g., second, surface 1908BL of second upper dielectric strip 1908B is removed. Illustratively, an etch or physical grinding process is used. In one embodiment, an over-etch process is used to slightly over-etch second lower and upper vias 2124A, 2124B and first lower and upper traces 2132A, 2132B. This ensures that shorting between vias 2124A, 2124B and/or traces 2132A, 2132B from excess electrically conductive material is avoided.

Second lower vias 2124A and first lower traces 2132A are electrically connected to corresponding first lower vias 1724. To illustrate, a second lower via 2124AA of the plurality of second lower vias 2124A is electrically connected to first lower via 1724A. Second lower vias 2124A extend from first lower vias 1724, through second lower dielectric strip 1908A to be adjacent or recessed from lower surface 1908AL of second lower dielectric strip 1908A. Likewise, a second upper via 2124BA of the plurality of second upper vias 2124B is electrically connected to first upper via 1824C. Second upper vias 2124B extend from first upper vias 1824, through second upper dielectric strip 1908B to be adjacent or recessed from lower surface 1908BL of second upper dielectric strip 1908B.

To further illustrate, a first lower trace 2132AA of the plurality of first lower traces 2132A is electrically connected to first lower via 1724D. More particularly, a first end 2134 of first lower trace 2132AA is electrically connected to first lower via 1724D. After formation of second lower and upper vias 2124A, 2124B and first lower and upper traces 2132A, 2132B assembly 1400B is inspected to insure that all second lower and upper via apertures 2022A, 2022B and first lower and upper trace channels 2026A, 2026B are properly filled with electrically conductive material, i.e., to inspect the integrity of second lower and upper vias 2124A, 2124B and first lower and upper traces 2132A, 2132B.

In one embodiment, any defective or unformed second lower and upper vias 2124A, 2124B and first lower and upper traces 2132A, 2132B detected during the inspection are corrected, e.g., by etch removal of second lower and upper vias 2124A, 2124B and first lower and upper traces 2132A, 2132B, reapplication of the electrically conductive material to reform second lower and upper vias 2124A, 2124B and first lower and upper traces 2132A, 2132B, and removal of any excess electrically conductive material. In this manner, the two-sided wafer escape packages are fabricated with a maximum yield.

In one embodiment, second lower and upper vias 2124A, 2124B are formed to have a larger diameter than the width of first lower and upper traces 2132A, 2132B and/or the diameter of first lower and upper vias 1724 or 1824. As discussed above, by forming second lower and upper vias 2124A, 2124B with the appropriate diameter, tolerance in the positioning of second lower and upper vias 2124A, 2124B is accommodated.

In one embodiment of the invention, trace channels 2026A, 2026B (FIGS. 20 and 21) are optimally formed in a shape suited to holding a metal layer, such as a copper metal layer, in place. In one embodiment of the invention, trace channels 2026A, 2026B are formed to be Gaussian in shape. In one embodiment of the invention, trace channels 2026A, 2026B are formed to be v-shaped. In one embodiment of the invention trace channels 2026A, 2026B are formed to be a generally trapezoidal shape.

In one embodiment of the invention, trace channels 2026A, 2026B are also formed such that the inner surface of the trace channel is textured or rough. This provides even better bonding between the metal layer and the surface of the trace channel 2026A, 2026B. In one embodiment of the invention, the surface of the metal layer to be applied is also textured, or matted, to provide even better bonding between the metal layer and the surface of the trace channels 2026A, 2026B.

Figure 21A:
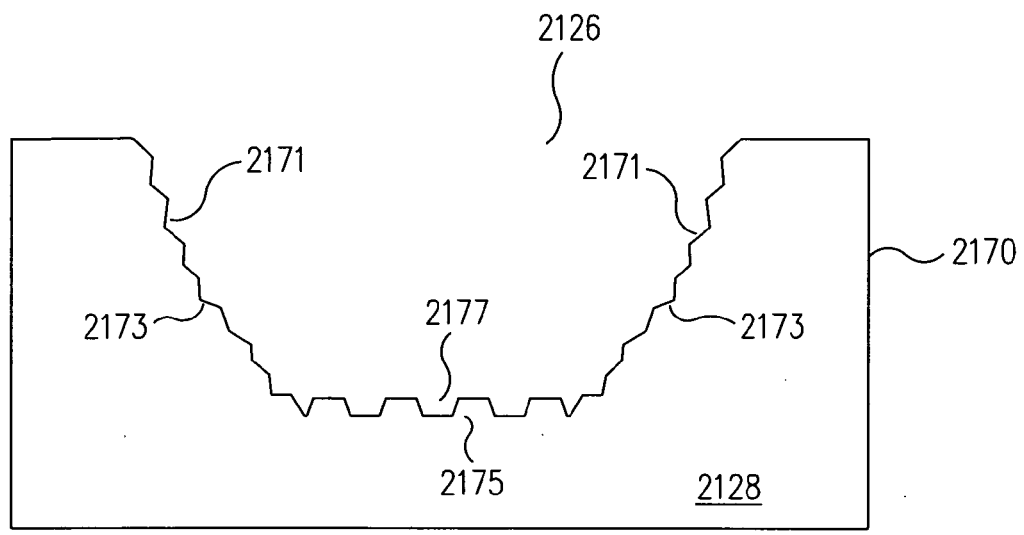

FIG. 21A shows one embodiment of a cross section 2170 of a shaped trace channel 2126, as shaped trace channel 2126 would appear at an end 2128 of shaped trace channel 2126. Note that shaped trace channel 2126 is similar to trace channels 2026A, 2026B in FIGS. 20 and 21 and end 2128 of shaped trace channel 2126 corresponds to first end 2134 of trace channels 2026A, 2026B in FIG. 20. As can be seen in FIG. 21A, shaped trace channel 2126 is generally trapezoidal in shape and, in one embodiment, includes roughened texture 2171 on sides 2173. In addition, in one embodiment, bottom 2175 of shaped trace channel 2126 is milled to include teeth 2177.

Figure 21B:
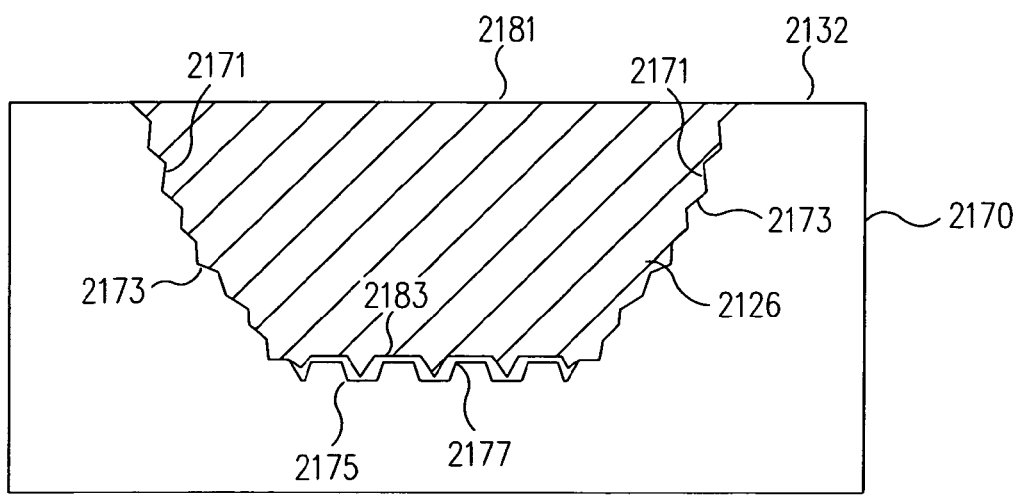

FIG. 21B shows one embodiment of an electrically conductive trace 2132 formed in shaped trace channel 2126 by applying a metal layer 2181, such as a copper metal layer, to shaped trace channel 2126. Note that electrically conductive trace 2132 is similar to electrically conductive traces 2132A, 2132B in FIG. 21. As seen in FIG. 21B, metal layer 2181 adheres readily to roughened texture 2171 on sides 2173 of shaped trace channel 2126 and teeth 2177 on bottom 2175 of shaped trace channel 2126 mesh with matted surface 2183 of metal layer 2181.

Using shaped trace channels, such as shaped trace channel 2126, according to the present invention, results in metal layer 2181 being in contact with more surface area of shaped trace channel 2126, thereby improving bonding and decreasing instances of metal separation. In addition, roughened texture 2171 on sides 2173 of shaped trace channel 2126 and teeth 2177 on bottom 2175 of shaped trace channel 2126 result in even more secure bonding between metal layer 2181 and shaped trace channel 2126.

In the one embodiment of the invention shown in FIGS. 21A and 21B, shaped trace channel 2126 is generally trapezoidal shape. However, those of skill in the art will readily recognize that shaped trace channel 2126 can be formed in a variety of shapes such as Gaussian, semicircular, semi oval, square or v-shaped.

Figure 22:
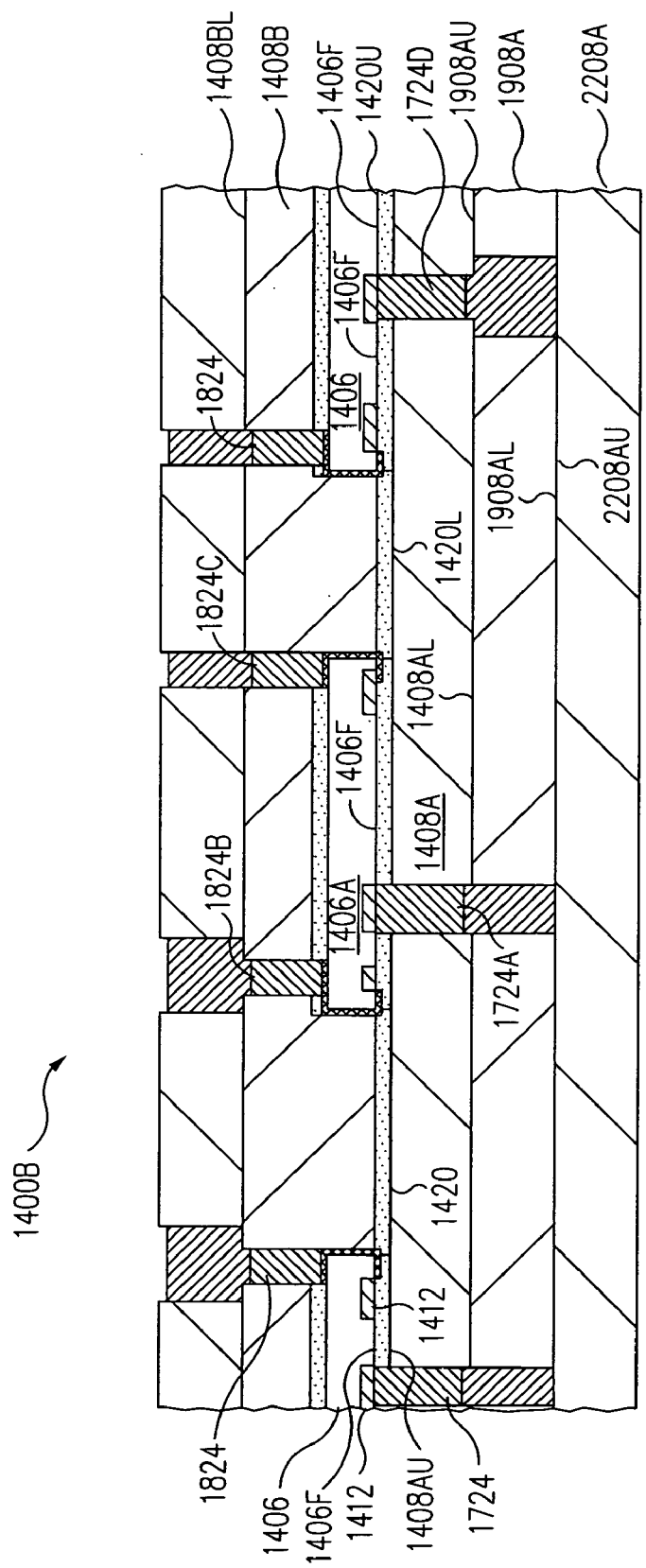

FIG. 22 is a cross-sectional view of assembly 1400B of FIG. 21 at a further stage during the fabrication of a plurality of two-sided wafer escape packages in accordance with one embodiment of the present invention. Referring now to FIG. 22, a third lower dielectric strip 2208A is mounted to second lower dielectric strip 1908A. More particularly, an upper, e.g., first, surface 2208AU of third lower dielectric strip 2208A is mounted to lower surface 1908AL of second lower dielectric strip 1908A. Third lower dielectric strip 2208A is similar to second lower dielectric strip 1908A and mounted in a manner similar to that discussed above with regards to mounting of second lower dielectric strip 1908A to first lower dielectric strip 1408A.

Figure 23:
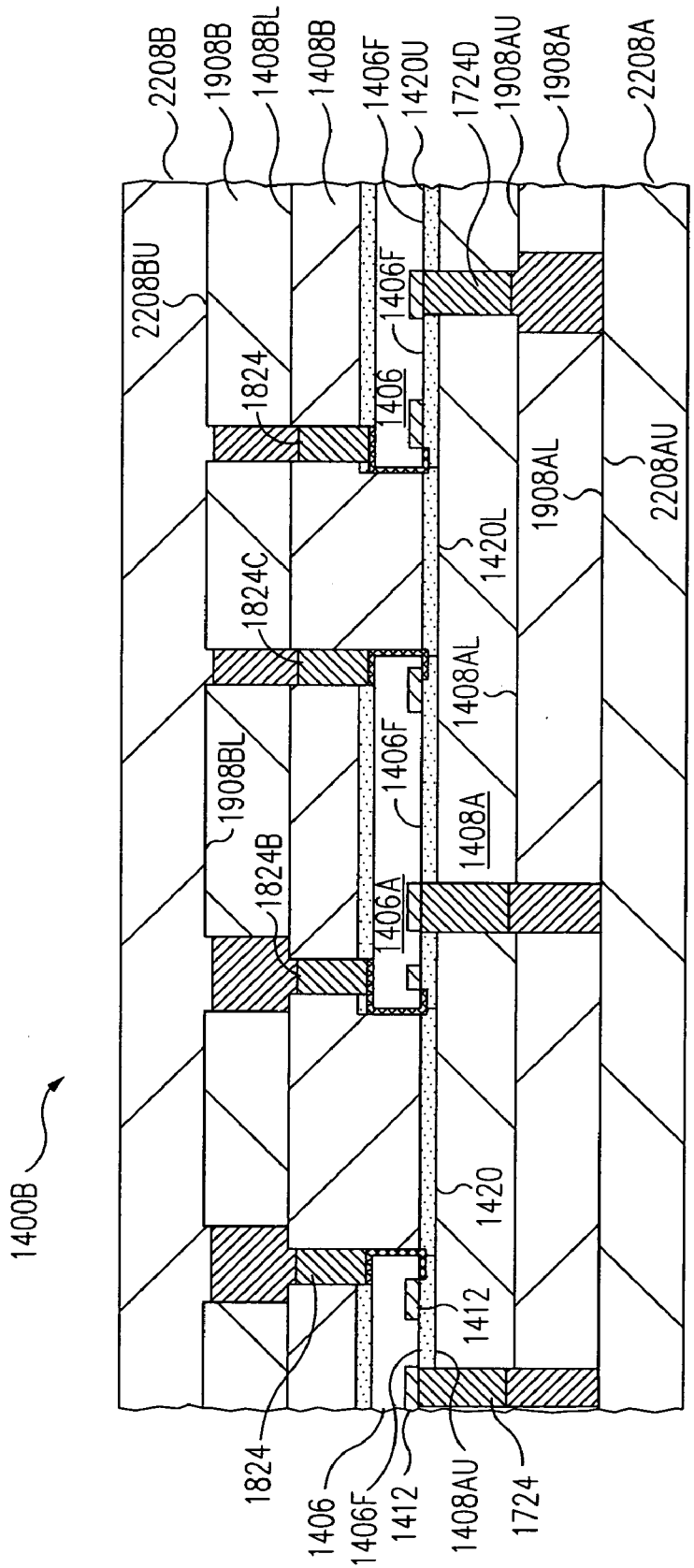

FIG. 23 is a cross-sectional view of assembly 1400B of FIG. 22 at a further stage during the fabrication of a plurality of two-sided wafer escape packages in accordance with one embodiment of the present invention. Referring now to FIG. 23, a third upper dielectric strip 2208B is mounted to second upper dielectric strip 1908B. More particularly, an upper, e.g., first, surface 2208BU of third upper dielectric strip 2208B is mounted to lower surface 1908BL of second upper dielectric strip 1908B. Third upper dielectric strip 2208B is similar to second upper dielectric strip 1908B and mounted in a manner similar to that discussed above with regards to mounting of second upper dielectric strip 1908B to first upper dielectric strip 1408B.

Figure 24:
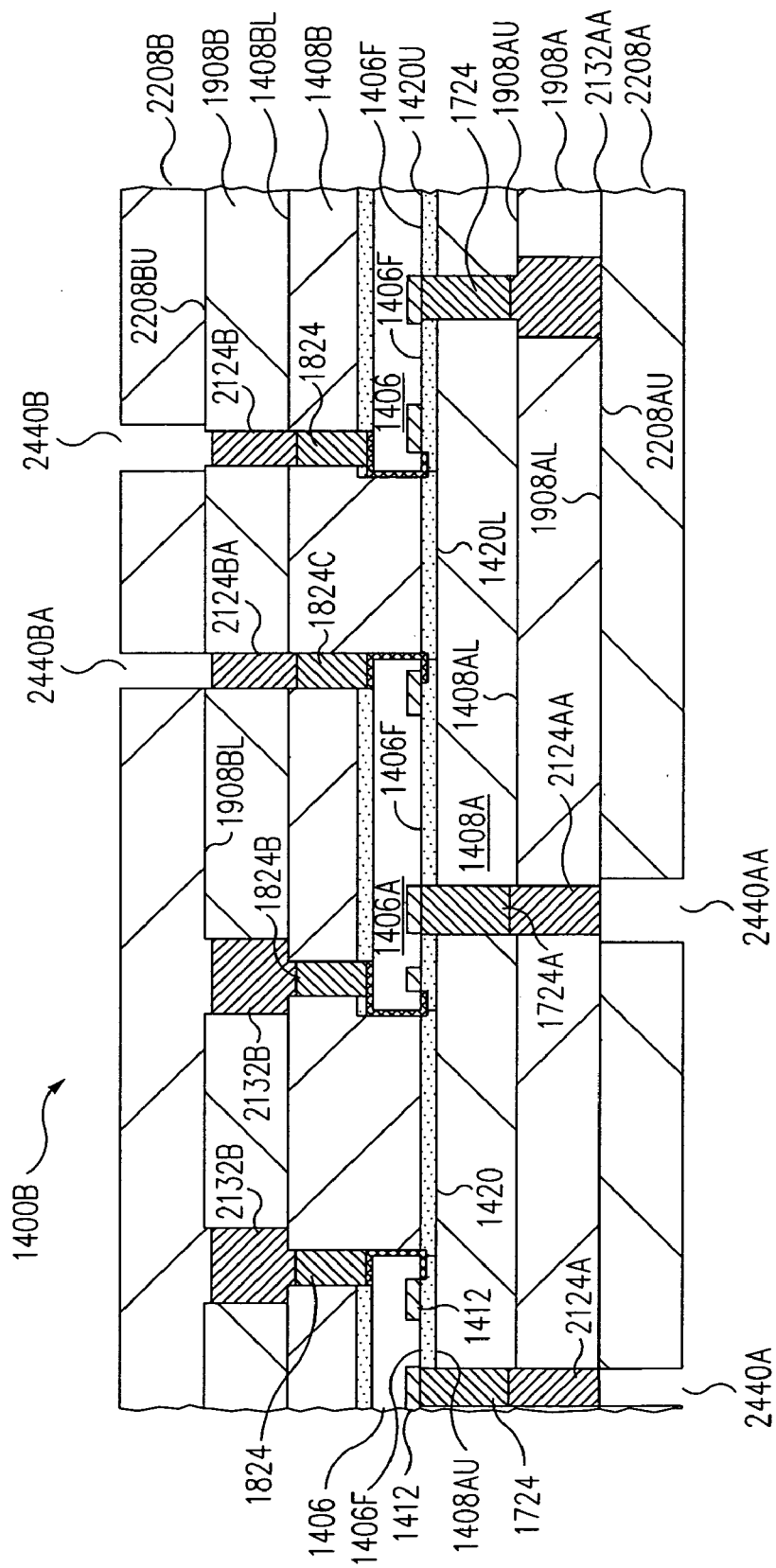

FIG. 24 is a cross-sectional view of assembly 1400B of FIG. 23 at a further stage during the fabrication of a plurality of two-sided wafer escape packages in accordance with one embodiment of the present invention. As shown in FIG. 24, a plurality of lower and upper land apertures 2440A and 2440B are formed using a laser, i.e., using laser ablation. Lower land apertures 2440A extend through third lower dielectric strip 2208A to second lower vias 2124A. In one embodiment, lower land apertures 2440A are cylindrical in shape but can be patterned in a variety of shapes depending upon the particular interconnection structure used, e.g., interconnection balls or lands. Likewise, upper land apertures 2440B extend through third upper dielectric strip 2208B to second upper vias 2124B. In one embodiment, upper land apertures 2440B are cylindrical in shape but can be patterned in a variety of shapes depending upon the particular interconnection structure used, e.g., interconnection balls or lands.

Second lower vias 2124A are exposed through lower land apertures 2440A. To illustrate, lower land aperture 2440AA of the plurality of lower land apertures 2440A extends through third lower dielectric strip 2208A to second lower via 2124AA. Likewise, second upper vias 2124B are exposed through upper land apertures 2440B. To illustrate, upper land aperture 2440BA of the plurality of upper land apertures 2440B extends through third upper dielectric strip 2208B to second upper via 2124BA.

Lower and upper land apertures 2440A, 2440B are formed in a manner similar to second lower and upper via apertures 2022A, 2022B of FIG. 20 so formation of lower and upper land apertures 2440A, 2440B is not discussed in detail here to avoid detracting from the principals of the invention.

Figure 25:
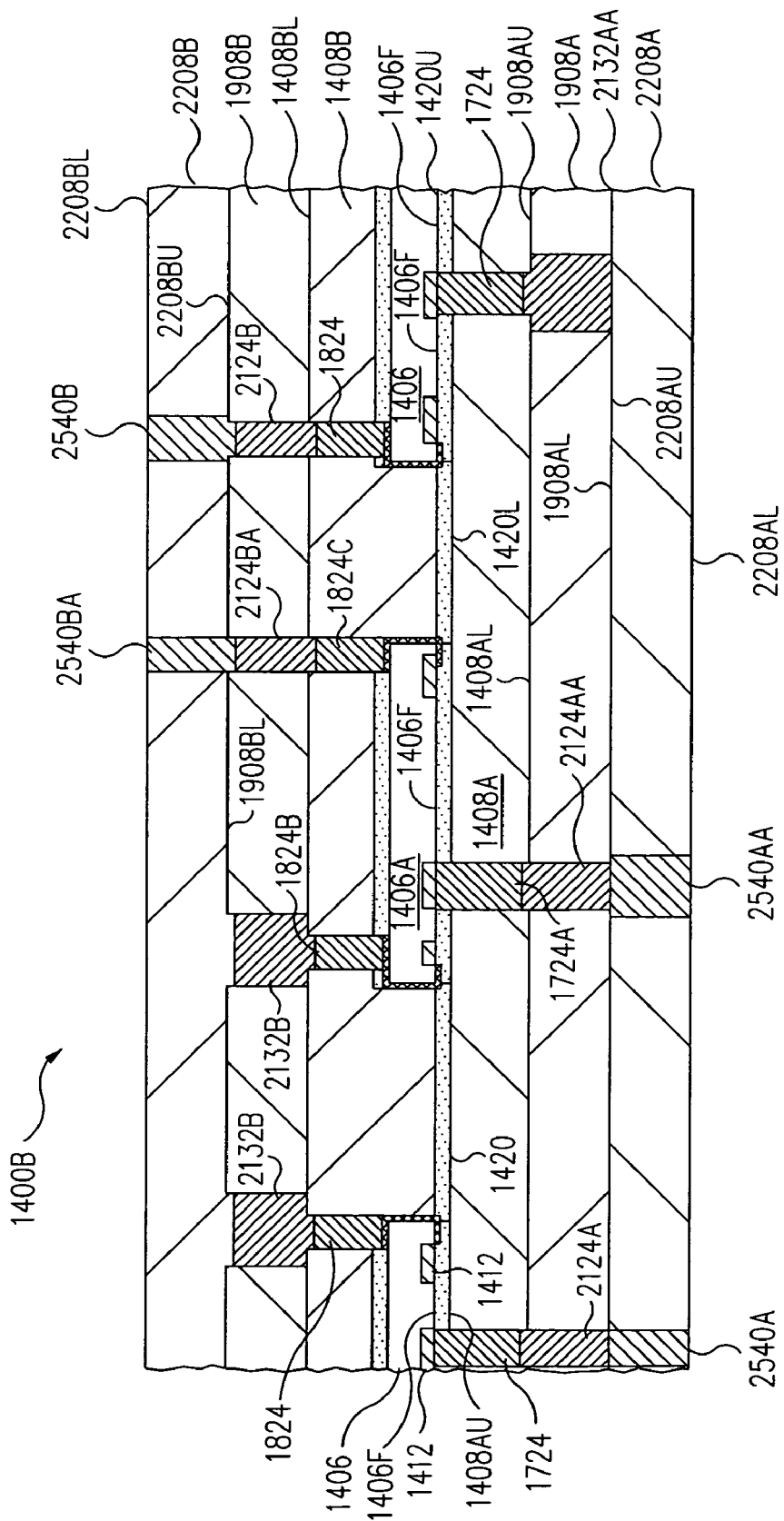

As seen in FIG. 25, lower and upper land apertures 2440A, 2440B are filled with an electrically conductive material, e.g., a metal or metal containing material, an electrically conductive adhesive, or solder paste, to form electrically conductive lower and upper lands 2540A, 2540B. Lower and upper land apertures 2440A, 2440B are filled to form lower and upper lands 2540A, 2540B in a manner similar to that discussed with regard to second lower and upper vias 2124A, 2124B of FIG. 21. Consequently, formation of lower and upper lands 2540A, 2540B is not discussed in detail here to avoid detracting from the principals of the invention.

After formation of lower and upper lands 2540A, 2540B, any excess electrically conductive material is removed. Illustratively, an etch or physical grinding process is used as discussed in more detail above.

In one embodiment, an over-etch process is used to slightly over-etch lower and upper lands 2540A, 2540B. Thus, lower lands 2540A remain recessed within lower land apertures 2440A and upper lands 2540B remain recessed within upper land apertures 2440B. This ensures that shorting between lower and upper lands 2540A, 2540B from excess electrically conductive material is avoided.

Lower lands 2540A are electrically connected to corresponding second lower vias 2124A. To illustrate, lower land 2540AA of the plurality of lower lands 2540A is electrically connected to second lower via 2124AA. Lower lands 2540A extend from second lower vias 2124A through third lower dielectric strip 2208A to be adjacent or slightly recessed from lower surface 2208AL of third lower dielectric strip 2208A. Likewise, upper lands 2540B are electrically connected to corresponding second upper vias 2124B. To illustrate, upper land 2540BA of the plurality of upper lands 2540B is electrically connected to second upper via 2124BA. Upper lands 2540B extend from second upper vias 2124B through third upper dielectric strip 2208B to be adjacent or slightly recessed from lower surface 2208BL of third upper dielectric strip 2208B.

After formation of lower and upper lands 2540A, 2540B, assembly 1400B is inspected to insure that all lower and upper land apertures 2440A, 2440B are properly filled with electrically conductive material, i.e., to inspect the integrity of lower and upper lands 2540A, 2540B. In one embodiment, any defective or unformed lower and upper lands 2540A, 2540B detected during the inspection are corrected, e.g., by etch removal of lower and upper lands 2540A, 2540B, reapplication of the electrically conductive material to reform lower and upper lands 2540A, 2540B, and removal of any excess electrically conductive material. In this manner, the two-sided wafer escape packages are fabricated with a maximum yield.

After formation of lower and upper lands 2540A, 2540B, in one embodiment, a solder on paste (SOP) (not shown) is applied to lower and upper lands 2540A, 2540B. This solder on paste is reflowed, i.e., heated to a melt and cooled to resolidify, to form lower and upper lands 2540A, 2540B. In accordance with this embodiment, the resulting plurality of two-sided wafer escape packages is a land grid array package. The solder lands are used to electrically connect the plurality of two-sided wafer escape packages to the larger substrate, e.g., a mother or daughter board, for example, using a high lead solder such as a 90/10 lead/tin solder.

Figure 26:
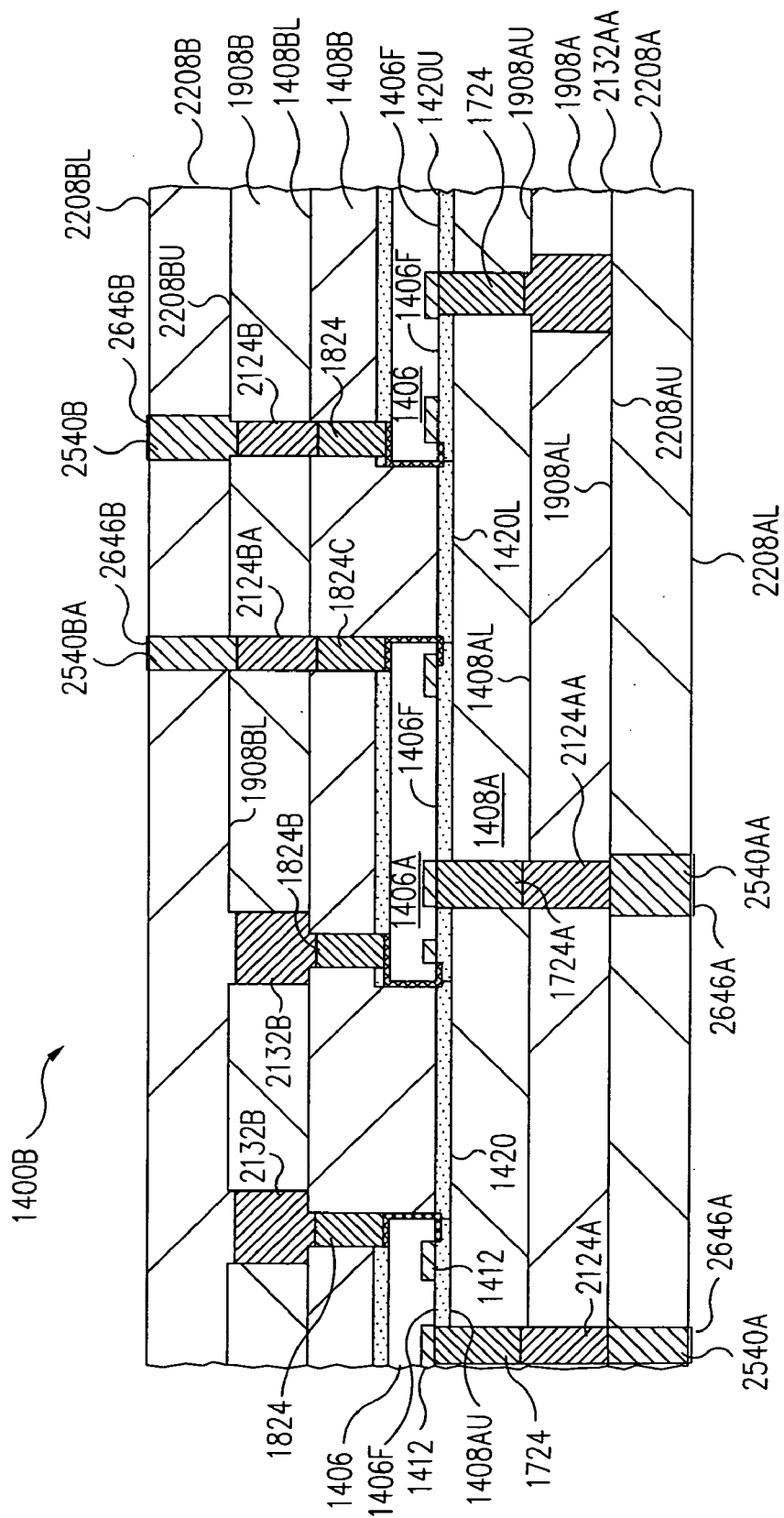

In another embodiment, a ball grid array package is formed. More particular, after formation of lower and upper lands 2540A, 2540B, an organic solderability protectant (OSP), sometimes called an organic solderability preservative, is applied to lower and upper lands 2540A, 2540B. The organic solderability protectant, which is represented as items 2646A, 2646B in FIG. 26 in accordance with this embodiment, enhances the solder wet-ability of lower and upper lands 2540A, 2540B. For simplicity of discussion, the organic solderability protectant is hereinafter referred to as OSP 2646A, 2646B. However, in another embodiment, OSP 2646A, 2646B is not used.

Figure 27:
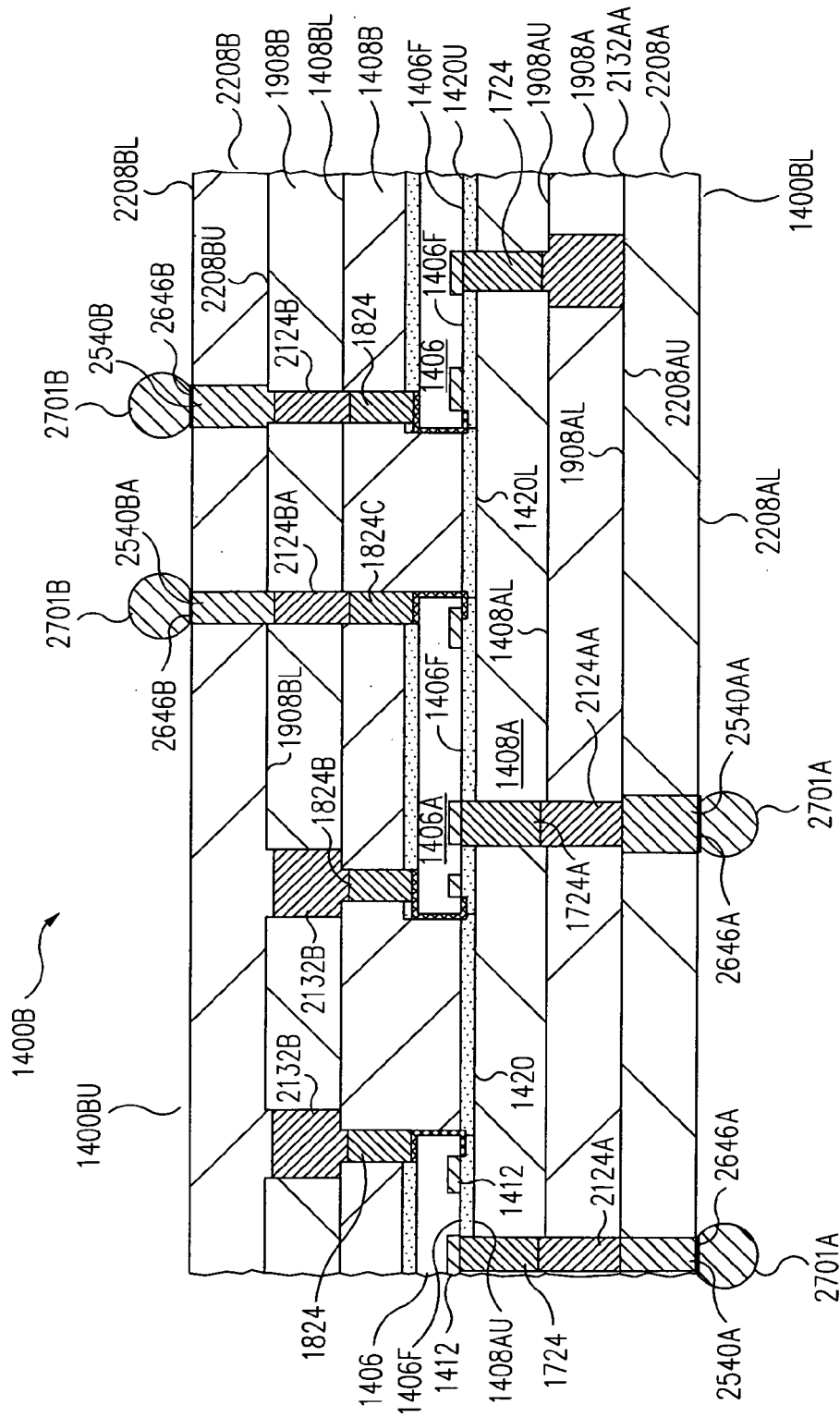

FIG. 27 is a cross-sectional view of assembly 1400B of FIG. 25 at a further stage during the fabrication of a plurality of two-sided wafer escape packages in accordance with one embodiment of the present invention. Referring now to FIG. 27, electrically conductive lower and upper interconnection balls 2701A, 2701B, e.g., eutectic lead/tin solder, are formed on lower and upper lands 2540A, 2540B, respectively. Lower and upper interconnection balls 2701A, 2701B are formed in a conventional manner. During formation of lower and upper interconnection balls 2701A, 2701B, OSP 2646A, 2646B, if present, is consumed.

Lower and upper interconnection balls 2701A, 2701B are used to electrically connect two-sided wafer escape packages of the invention to the larger substrate, e.g., a mother or daughter board. Assembly 1400B is then singulated, e.g., using a mechanical saw or laser, to form the plurality of two-sided wafer escape packages in the same manner discussed above with respect to FIGS. 12 and 13.

Each lower and upper interconnection ball 2701A, 2701B is electrically connected to a corresponding bond pad 1412 as discussed above. In this manner, the pattern of bond pads 1412 is redistributed to the pattern of lower and upper interconnection balls 2701A, 2701B on both lower surface 2208AL of third lower dielectric layer 2208A and lower surface 2208BL of third upper dielectric layer 2208B. That is to say, the pattern of bond pads 1412 is redistributed to the pattern of lower and upper interconnection balls 2701A, 2701B across both upper surface 1400BU of two-sided wafer escape packages 1400B and lower surface 1400BL of two-sided wafer escape packages 1400B.

Further, lower and upper interconnection balls 2701A, 2701B are connected to bond pads 1412 using a minimum path length as discussed in more detail above. This fact reduces electrical resistance and reactance and provides a sturdier structure than prior art methods.

As set forth above, (1) two dielectric strips are applied, one each, to both sides of a plurality of electronic devices; (2) the dielectric strips are laser patterned to form via apertures and/or trace channels to access both sides of the plurality of electronic devices; (3) the via apertures and/or trace channels are filled with electrically conductive material to form vias and/or traces; (4) excess electrically conductive material is removed from the lower surface of both of the dielectric strips; and (5) the formed vias and/or traces are inspected and corrected, if necessary. This process is repeated any number of desired times until the desired redistribution is achieved.

Further, since the via apertures and/or trace channels are formed with a laser in one embodiment of the invention, any changes in the design layout of the via apertures and/or trace channels are relatively simple to execute. More particularly, these design layout changes are made in the computer software, e.g., the CAD software, which drives the laser. Accordingly, the design layout changes are made with some relatively simple programming and executed immediately.

Referring still to FIG. 27, although six dielectric strips 1408A, 1408B, 1908A, 1908B, 2208A and 2208B are illustrated and discussed above, more or less than six dielectric strips are used in other embodiments. Generally, at least two dielectric strips, e.g., first lower and upper dielectric strips 1408A and 1408B are used.

Further, although the vias, traces, and lands are discussed above as being formed in various dielectric strips for purposes of discussion, in light of this disclosure, those of skill in the art will understand that vias, traces, lands and/or combinations thereof can be formed in any single dielectric strip.

Further, although the vias, traces, and lands are discussed as distinct types of structures for purposes of discussion, in light of this disclosure, those of skill in the art will understand that vias, traces, and lands can be similar in structure. For example, a via or trace can form a land.

Still further, the via apertures, trace channels and land apertures are filled immediately after formation, i.e., before application of the next dielectric strip, with an electrically conductive material to form the vias, traces and lands, respectively, in the discussion above. However, in an alternative embodiment, the via apertures, trace channels, and land apertures are formed in some or all of dielectric strips. After formation, the via apertures, trace channels, and land apertures are filled at the same time, e.g., in a single plating operation, with an electrically conductive material to form the vias, traces, and lands, respectively.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process may be implemented by one of skill in the art in view of this disclosure.

What is claimed is:

1. A method of forming an electronic component package comprising:
    providing an electronic component, the electronic component having a plurality of bond pads formed on a first surface of the electronic component;
    forming electrically conductive traces connecting first selected bond pads of the plurality of bond pads on the first surface of the electronic component to corresponding bonding locations on a second surface of the electronic component;
    coupling the first surface of the electronic component to a first surface of a lower dielectric strip;
    coupling the second surface of the electronic component to a first surface of an upper dielectric strip;
    forming lower via apertures through the lower dielectric strip to expose second selected bond pads of the plurality of bond pads on the first surface of the electronic component;
    forming upper via apertures through the upper dielectric strip to expose the bonding locations on the second surface of the electronic component;

filling the lower via apertures with an electrically conductive material to form lower vias electrically coupled to the second selected bond pads of the plurality of bond pads on the first surface of the electronic component; and filling the upper via apertures with an electrically conductive material to form upper vias electrically coupled to the bonding locations on the second surface of the electronic component.

2. The method of forming an electronic component package of claim 1, further comprising:

forming trace channels in the upper or lower dielectric layer.

3. The method of forming an electronic component package of claim 2, wherein the trace channels are optimally shaped trace channels.

4. The method of forming an electronic component package of claim 3 further comprising:

applying a metal layer to an inner surface of at least one of said the trace channels to form at least one electrically conductive trace.

5. The method of claim 1 wherein excess electrically conductive material is formed on a second surface of the lower dielectric strip, the method further comprising removing the excess electrically conductive material from the second surface of the lower dielectric strip, further wherein excess electrically conductive material is formed on a second surface of the upper dielectric strip, the method further comprising removing the excess electrically conductive material from the second surface of the upper dielectric strip.

6. The method of claim 5 wherein the removing the excess electrically conductive material from the second surface of the lower dielectric strip and the removing the excess electrically conductive material from the second surface of the upper dielectric strip is performed using an etch process.

7. The method of claim 6 wherein the lower vias extend from the bond pads through the lower dielectric strip to be adjacent the second surface of the lower dielectric strip, further wherein, the upper vias extend from the bonding locations through the upper dielectric strip to be adjacent the second surface of the upper dielectric strip.

8. The method of claim 6 wherein the lower vias extend from the bond pads through the lower dielectric strip to be recessed from the second surface of the lower dielectric strip, further wherein the upper vias extend from the bonding locations through the upper dielectric strip to be recessed from the second surface of the upper dielectric strip.

9. The method of claim 5 further comprising:
inspecting the integrity of the lower vias;
when the lower vias comprise defective lower vias removing the lower vias; and reapplying the electrically conductive material in the lower via apertures to reform the lower vias;
inspecting the integrity of the upper vias;
when the upper vias comprise defective upper vias removing the upper vias; and
reapplying the electrically conductive material in the upper via apertures to reform the upper vias.

10. The method of claim 1 wherein the coupling a first surface of an electronic component to a first surface of a lower dielectric strip comprises mounting the first surface of the electronic component to the first surface of the lower dielectric strip with an adhesive.

11. The method of claim 1 wherein the coupling a second surface of an electronic component to a first surface of a upper dielectric strip comprises mounting the second surface of the electronic component to the first surface of the upper dielectric strip with an adhesive.

12. A method of forming an electronic component package comprising:

providing an electronic component, the electronic component having a plurality of bond pads formed on a first surface of the electronic component;

forming electrically conductive traces connecting first selected bond pads of the plurality of bond pads on the first surface of the electronic component to corresponding bonding locations on a second surface of the electronic component;

coupling the first surface of the electronic component to a first surface of a lower dielectric strip with an adhesive;

coupling the second surface of the electronic component to a first surface of an upper dielectric strip with an adhesive;

forming lower via apertures through the lower dielectric strip and the adhesive to expose second selected bond pads of the plurality of bond pads on the first surface of the electronic component;

forming upper via apertures through the upper dielectric strip to expose the bonding locations on the second surface of the electronic component;

filling the lower via apertures with an electrically conductive material to form lower vias electrically coupled to the second selected bond pads of the plurality of bond pads on the first surface of the electronic component; and filling the upper via apertures with an electrically conductive material to form upper vias electrically coupled to the bonding locations on the second surface of the electronic component.

* * * * *